United States Patent
Yutani et al.

(10) Patent No.: US 8,728,853 B2
(45) Date of Patent: May 20, 2014

(54) SOLID-STATE IMAGE SENSING DEVICE AND METHOD OF MANUFACTURING THE SAME

(75) Inventors: Akie Yutani, Kawasaki (JP); Yasutaka Nishioka, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 200 days.

(21) Appl. No.: 13/265,513

(22) PCT Filed: Apr. 24, 2009

(86) PCT No.: PCT/JP2009/058127
§ 371 (c)(1),
(2), (4) Date: Oct. 20, 2011

(87) PCT Pub. No.: WO2010/122657
PCT Pub. Date: Oct. 28, 2010

(65) Prior Publication Data
US 2012/0037968 A1 Feb. 16, 2012

(51) Int. Cl.
*H01L 21/00* (2006.01)
(52) U.S. Cl.
USPC ......... 438/73; 257/292; 257/E21.218; 216/37
(58) Field of Classification Search
None
See application file for complete search history.

(56) References Cited

U.S. PATENT DOCUMENTS

| 2003/0234432 A1 | 12/2003 | Song et al. |
| 2004/0147068 A1 | 7/2004 | Toyoda et al. |
| 2005/0122417 A1 | 6/2005 | Suzuki |
| 2009/0020795 A1 | 1/2009 | Doi et al. |
| 2009/0045477 A1 | 2/2009 | Narui |

FOREIGN PATENT DOCUMENTS

| JP | 2000-012822 | 1/2000 |
| JP | 2000-196051 | 7/2000 |
| JP | 2004-023107 | 1/2004 |
| JP | 2004-228425 | 8/2004 |
| JP | 2004-235609 | 8/2004 |
| JP | 2004-335588 | 11/2004 |
| JP | 2005-142510 | 6/2005 |
| JP | 2006-040986 | 2/2006 |
| JP | 2006-261596 | 9/2006 |
| JP | 2008-041958 | 2/2008 |
| JP | 2009-026848 | 2/2009 |
| WO | WO 03/096421 A1 | 11/2003 |
| WO | WO 2007/055141 A1 | 5/2007 |

*Primary Examiner* — Sonya D McCall Shepard
(74) *Attorney, Agent, or Firm* — McDermott Will & Emery LLP

(57) ABSTRACT

By selectively anisotropically etching a stack film formed to cover a plurality of photodiodes and a gate electrode layer of a MOS transistor, the stack film remains on each of the plurality of photodiodes to form a lower antireflection coating and the stack film remains on a sidewall of the gate electrode layer to form a sidewall. Using the gate electrode layer and the sidewall as a mask, an impurity is introduced to form a source/drain region of the MOS transistor. After the impurity was introduced, an upper antireflection coating is formed at least on a lower antireflection coating. At least any of the upper antireflection coating and the lower antireflection coating is etched such that the antireflection coatings on the two respective photodiodes are different in thickness from each other.

6 Claims, 35 Drawing Sheets

SOLID-STATE IMAGE SENSING DEVICE AND METHOD OF MANUFACTURING THE SAME

RELATED APPLICATIONS

This application is the U.S. National Phase under 35 U.S.C. §371 of International Application No. PCT/JP2009/058127, filed on Apr. 24, 2009, the disclosure of which is incorporated by reference herein.

TECHNICAL FIELD

The present invention relates to a solid-state image sensing device and a method of manufacturing the same, and particularly to a solid-state image sensing device having a photoelectric conversion portion and an insulating gate field effect transistor portion and a method of manufacturing the same.

BACKGROUND ART

A solid-state image sensing device having a plurality of photodiodes serving as photoelectric conversion portions for incident light and a MOS (Metal Oxide Semiconductor) transistor serving as an insulating gate field effect transistor portion is disclosed, for example, in Japanese Patent Laying-Open No. 2004-228425, Japanese Patent Laying-Open No. 2008-041958, and the like.

Japanese Patent Laying-Open No. 2004-228425 above describes simultaneous formation of an antireflection coating for a photodiode and a sidewall along the side of a gate of a MOS transistor for decreasing the number of steps and simplification of the steps.

Japanese Patent Laying-Open No. 2008-041958, however, describes the fact that a thickness of the antireflection coating and a thickness of the sidewall cannot independently be controlled with the manufacturing method in Japanese Patent Laying-Open No. 2004-228425.

In this Japanese Patent Laying-Open No. 2008-041958, an antireflection coating and a sidewall are formed in the same step from an insulating film including three layers of a lower layer, an intermediate layer and an upper layer. According to this publication, an index of refraction and a thickness of the antireflection coating are controlled by the two layers of the lower and intermediate insulating films and a thickness of the sidewall is controlled by the three layers of the lower layer, the intermediate layer and the upper layer, so that each thickness of the antireflection coating and the sidewall can independently be controlled.

CITATION LIST

Patent Literature

PTL 1: Japanese Patent Laying-Open No. 2004-228425
PTL 2: Japanese Patent Laying-Open No. 2008-041958

SUMMARY OF INVENTION

Technical Problem

Generally, a width of a sidewall follows the scaling law. A thickness of an antireflection coating, however, does not follow the scaling law, because an optimal structure is determined depending on a wavelength of incident light. According to Japanese Patent Laying-Open No. 2008-041958, however, a thickness of the antireflection coating is equal to or smaller than a width of the sidewall without exception. Therefore, if a width of the sidewall becomes smaller in accordance with the scaling law, a thickness of the antireflection coating should also accordingly be made smaller. Thus, as a transistor is made smaller, application of this technique becomes difficult.

In addition, according to Japanese Patent Laying-Open No. 2008-041958, an index of refraction and a thickness of the antireflection coating are optimally controlled by the two layers of the lower and intermediate insulating films. In order to control the index of refraction of the antireflection coating only with the lower and intermediate insulating films, however, an index of refraction of the upper insulating film should be as high as that of an interlayer insulating film on the antireflection coating, because, if the interlayer insulating film and the upper insulating film are different from each other in index of refraction, reflection that occurs at an interface therebetween is unignorable. Therefore, in a case where it is desired that the antireflection coating includes three (or more) layers and the upper insulating film is different in index of refraction from the interlayer insulating film, the technique according to Japanese Patent Laying-Open No. 2008-041958 is not applicable in principle and restrictions in connection with the antireflection coating are many.

Further, an optimal structure of the antireflection coating is different depending on a wavelength of incident light. Therefore, in a case where light receiving pixels are different for each of three primary colors of R (Red), G (Green), and B (Blue) as in a general image sensing element, an antireflection coating is desirably optimized for each pixel. In Japanese Patent Laying-Open No. 2008-041958, however, the antireflection coating and the sidewall are formed in the same step and therefore the antireflection coatings are identical in thickness for all pixels of R, G and B due to restrictions imposed by the sidewall. Thus, the antireflection coating should inevitably be optimized for light having a wavelength of any of R, G and B, and sufficient antireflection effects cannot be obtained for light having other wavelengths.

The present invention was made in view of the problems above, and an object of the present invention is to provide a solid-state image sensing device capable of adapting to reduction in size, having less restriction in connection with an antireflection coating, and optimizing an antireflection effect for each pixel, and a method of manufacturing the same.

Solution to Problem

A method of manufacturing a solid-state image sensing device according to one embodiment of the present invention is a method of manufacturing a solid-state image sensing device including a plurality of photoelectric conversion portions constituting a plurality of pixels, an insulating gate field effect transistor portion, and a plurality of first films formed on the plurality of photoelectric conversion portions respectively, and the method includes the following steps.

A stack film constituted of a plurality of insulating films is formed to cover the plurality of photoelectric conversion portions and a gate electrode layer of the insulating gate field effect transistor portion. By selectively anisotropically etching the stack film, the stack film remains on each of the plurality of photoelectric conversion portions to form a lower film, and the stack film remains on a sidewall of the gate electrode layer to form a sidewall insulating film. An impurity is introduced into a region not covered with the gate electrode layer and the sidewall insulating film, to thereby form a source/drain region of an insulating gate field effect transistor. After introduction of the impurity, an upper film is formed at least on the lower film. At least any of the upper film and the lower film is etched such that the first films on at least two photoelectric conversion portions of the plurality of photoelectric conversion portions are different in thickness from each other.

Advantageous Effects of Invention

According to this embodiment, since a width of a sidewall insulating film and a thickness of a first film can independently be controlled, adaptation to reduction in size is facilitated.

In addition, since an upper film is formed on a lower film after the sidewall insulating film and the lower film are formed from a stack film, restrictions imposed on the first film are lessened as compared with a case where the first film and the sidewall insulating film are formed in the same step.

Moreover, since the upper film is formed after the sidewall insulating film and the lower film are formed from the stack film and at least any of the lower film and the upper film is removed, antireflection effects can be optimized for each pixel.

DESCRIPTION OF EMBODIMENTS

An embodiment of the present invention will be described hereinafter with reference to the drawings.

Embodiment 1

A configuration of a solid-state image sensing device in the present embodiment will initially be described.

Figure 1:
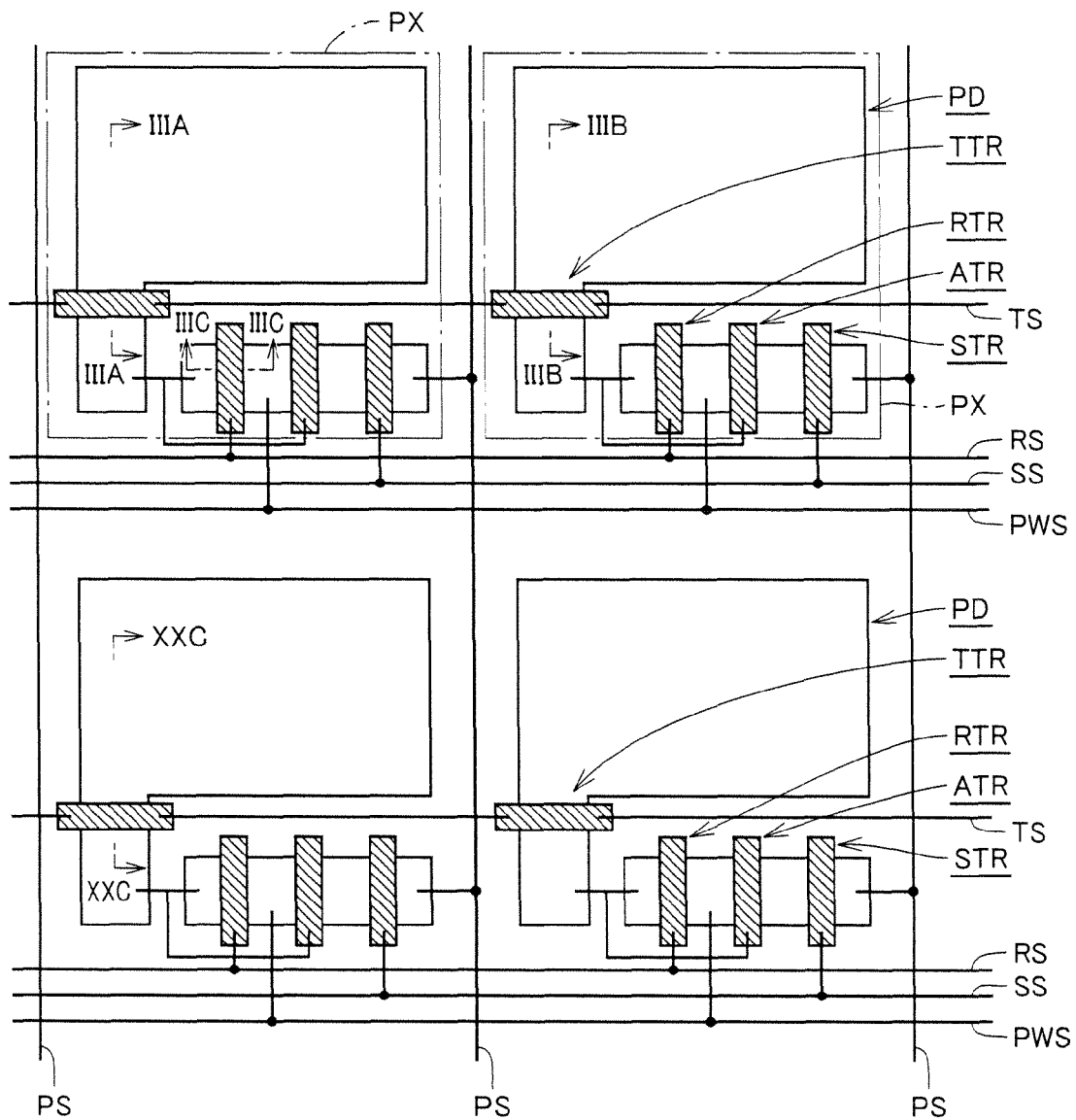
FIG. 1 is a plan view schematically showing a configuration of a solid-state image sensing device in Embodiment 1 of the present invention.
Figure 2:
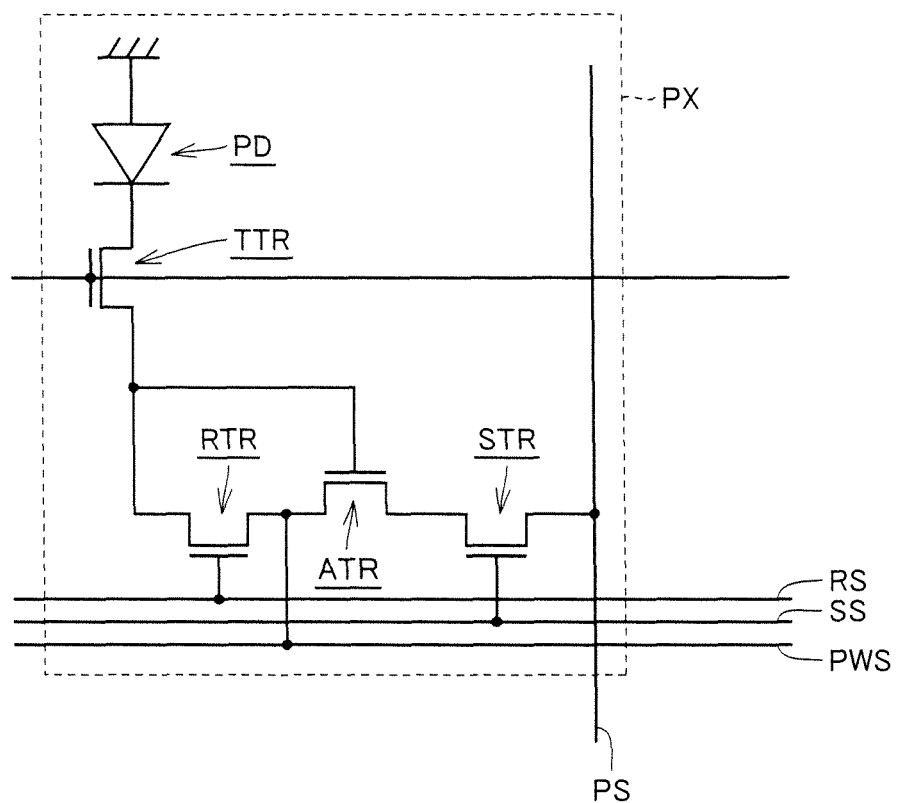
FIG. 2 is a circuit diagram showing a circuit configuration of the solid-state image sensing device shown in FIG. 1.

Referring to FIGS. 1 and 2, a solid-state image sensing device in the present embodiment has a plurality of pixels PX. The plurality of pixels PX include pixels for sensing images of light of colors different from one another, and they have, for example, a pixel for sensing an image of red light (an R pixel), a pixel for sensing an image of green light (a G pixel), and a pixel for sensing an image of blue light (a B pixel).

Each of the plurality of pixels PX has, for example, a photodiode PD serving as a photoelectric conversion portion, a transistor for transfer TTR, a transistor for resetting RTR, a transistor for amplification ATR, and a transistor for selection STR.

Photodiode PD has a p-type region and an n-type region together forming a pn junction. On a light incident side of this photodiode PD, an antireflection coating (not shown) is formed. This antireflection coating preferably has a structure different depending on a color of light of which image is to be sensed (film thickness, film quality, etc.).

Each of transistor for transfer TTR, transistor for resetting RTR, transistor for amplification ATR, and transistor for selection STR is an insulating gate field effect transistor, and implemented, for example, by an n-channel MOS transistor. Each of these transistors has a pair of n-type source/drain regions formed in a surface of a semiconductor substrate and a gate electrode layer formed on a region of the semiconductor substrate lying between the pair of source/drain regions with a gate insulating film (a gate oxide film) being interposed. In addition, a sidewall (a sidewall insulating film: not shown) is formed to cover a sidewall of each gate electrode layer.

The p-type region of photodiode PD is connected, for example, to a ground potential. The n-type region of photodiode PD and an n-type source region of transistor for transfer TTR are electrically connected to each other, and they are formed, for example, of a common n-type region. A gate electrode layer of transistor for transfer TTR is electrically connected to a transfer signal line TS.

An n-type drain region of transistor for transfer TTR and an n-type source region of transistor for resetting RTR are electrically connected to each other. A gate electrode layer of transistor for resetting RTR is electrically connected to a reset signal line RS.

An n-type drain region of transistor for resetting RTR and an n-type source region of transistor for amplification ATR are electrically connected to each other, and formed, for example, of a common n-type region. A power supply line PWS is electrically connected to the n-type drain region of transistor for resetting RTR and the n-type source region of transistor for amplification ATR. A gate electrode layer of transistor for amplification ATR is electrically connected to the n-type drain region of transistor for transfer TTR and the n-type source region of transistor for resetting RTR.

An n-type drain region of transistor for amplification ATR and an n-type source region of transistor for selection STR are electrically connected to each other, and formed, for example, of a common n-type region. A gate electrode layer of transistor for selection STR is electrically connected to a selection signal line SS. An n-type drain region of transistor for selection STR is electrically connected to a vertical signal line PS.

In addition, a peripheral circuit performing an operation is formed in a portion other than a pixel portion, and these peripheral circuits also include transistors and these transistors are also implemented by insulating gate field effect transistors.

In connection with FIGS. 1 and 2, a configuration in which a group of transistors constituted of one transistor for resetting RTR, one transistor for amplification ATR and one transistor for selection STR is provided for a set of diode portions constituted of one photodiode PD and one transistor for transfer TTR has been described, however, a configuration in which a group of transistors above is provided for a plurality of sets of diode portions above may be adopted. For example, a group of transistors above may be shared by the plurality of sets of diode portions above connected in parallel.

A method of manufacturing a solid-state image sensing device in the present embodiment having a pixel 1 and a pixel 2 for sensing images of light of colors different from each other and a MOS transistor will now be described with reference to FIGS. 3 to 11.

Pixel 1 shown in (A) in each of FIGS. 3 to 11 corresponds, for example, to a cross-section along the line IIIA-IIIA in FIG. 1, and pixel 2 shown in (B) in each of FIGS. 3 to 11 corresponds, for example, to a cross-section along the line IIIB-IIIB in FIG. 1. In addition, the MOS transistor shown in (C) in each of FIGS. 3 to 11 corresponds, for example, to a cross-section along the line IIIC-IIIC in FIG. 1.

Figure 3:
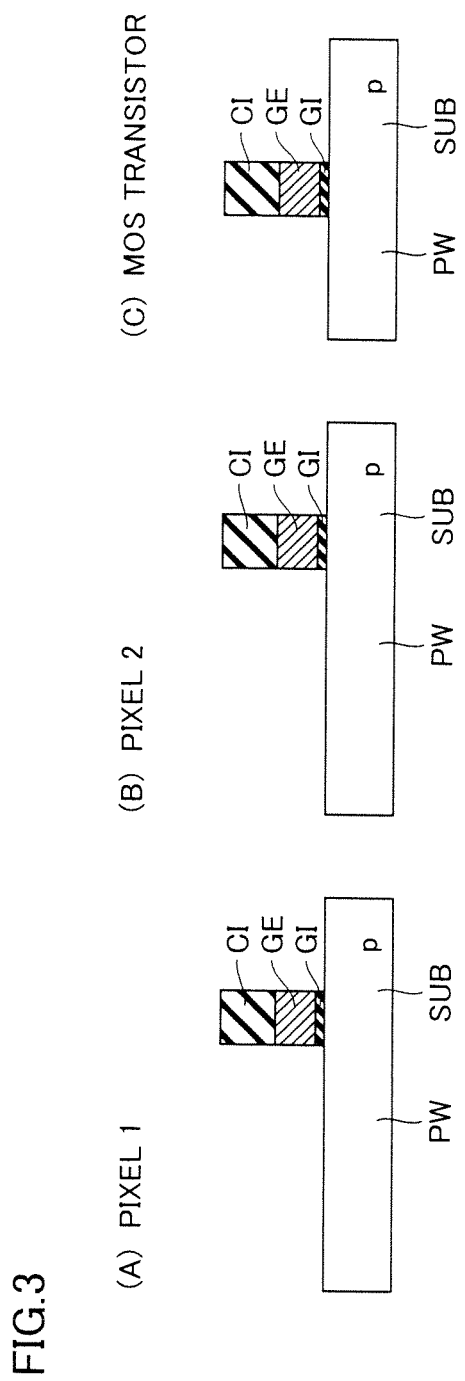
FIG. 3 is a schematic cross-sectional view showing a first step in a method of manufacturing a solid-state image sensing device in Embodiment 1 of the present invention.

Referring to FIG. 3, for example, an element isolation structure (not shown) or a p-type well region PW are formed in a surface of an n-type semiconductor substrate SUB composed of silicon. Thereafter, by oxidizing the surface of semiconductor substrate SUB, for example, a silicon oxide film GI is formed on the surface of semiconductor substrate SUB. On this silicon oxide film GI, for example, a polycrystalline silicon film GE and a silicon oxide film CI are successively formed by stacking.

Thereafter, using normal photolithography technique and etching technique, silicon oxide film CI, polycrystalline silicon film GE and silicon oxide film GI are patterned. Thus, a stack pattern constituted of a gate insulating film GI formed, for example, from a silicon oxide film, gate electrode layer GE formed, for example, from a polycrystalline silicon film, and a cap insulating film CI formed, for example, from a silicon oxide film is formed on each of pixel 1, pixel 2, and the MOS transistor.

Figure 4:
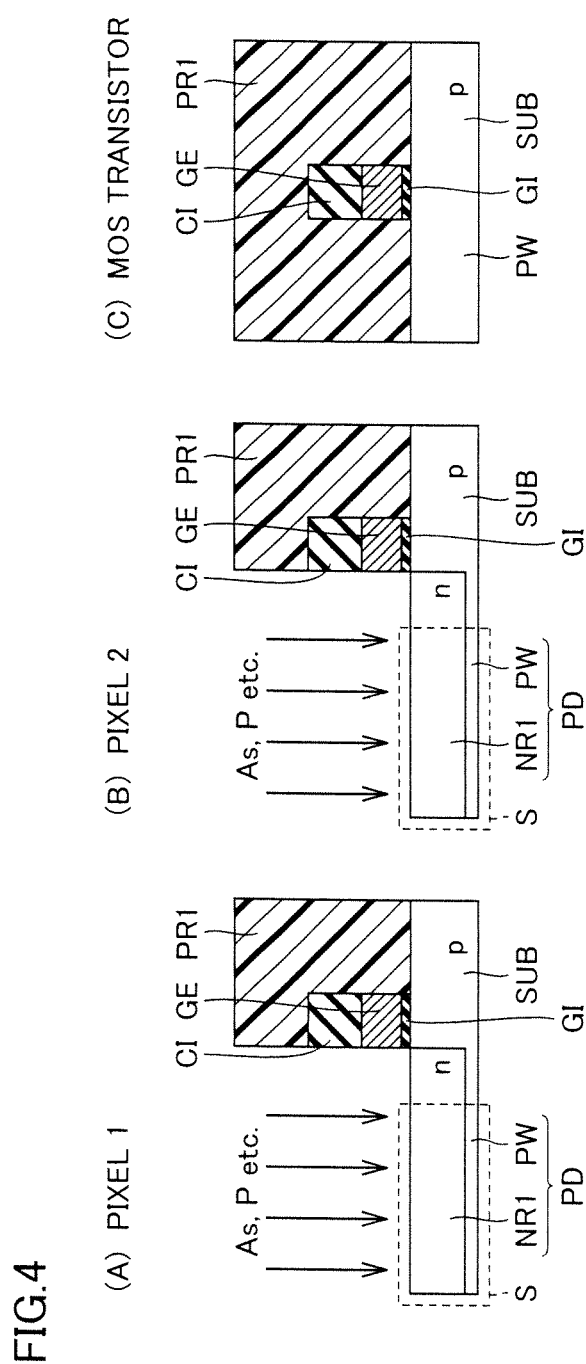
FIG. 4 is a schematic cross-sectional view showing a second step in the method of manufacturing a solid-state image sensing device in Embodiment 1 of the present invention.

Referring to FIG. 4, using the normal photolithography technique, a photoresist pattern PR1 is formed on the surface of semiconductor substrate SUB. This photoresist pattern PR1 is formed to provide openings on portions where photodiodes for pixel 1 and pixel 2 are to be formed respectively and to cover the MOS transistor. Using this photoresist pattern PR1 as a mask, ions, for example, of arsenic (As), phosphorus (P), or the like are implanted into the surface of semiconductor substrate SUB. As a result of this ion implantation, an n-type region NR1 is formed in the surface of semiconductor substrate SUB, and photodiode PD is formed by this n-type region NR1 and p-type well region PW, in a portion indicated with a region S. Thereafter, photoresist pattern PR1 is removed, for example, through ashing or the like.

Figure 5:
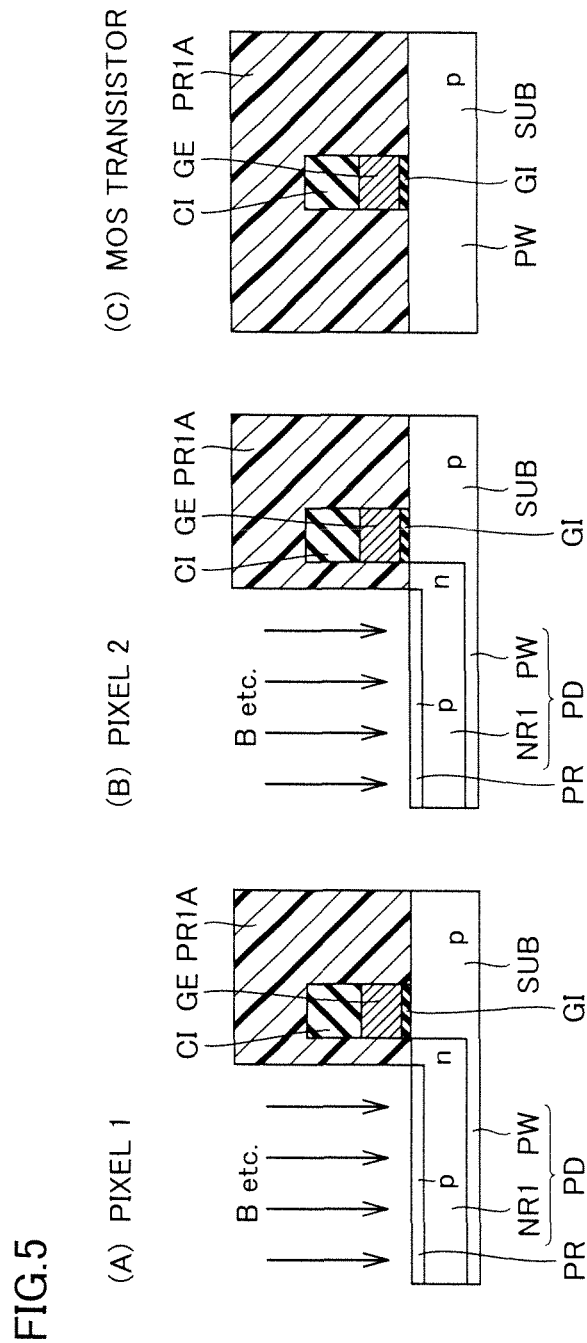
FIG. 5 is a schematic cross-sectional view showing a third step in the method of manufacturing a solid-state image sensing device in Embodiment 1 of the present invention.

Referring to FIG. 5, using the normal photolithography technique, a photoresist pattern PR1A is formed on the surface of semiconductor substrate SUB. This photoresist pattern PR1A is formed to provide openings on respective photodiodes PD of pixel 1 and pixel 2 and to cover the MOS transistor. Using photoresist pattern PR1A as a mask, ions, for example, of boron (B) or the like are implanted into the surface of semiconductor substrate SUB. As a result of this ion implantation, a $p^+$ region PR is formed in the surface of semiconductor substrate SUB. This $p^+$ region PR is formed to prevent electrons from being trapped by a trap potential present at the surface of semiconductor substrate SUB and to lower noise. Formation of this $p^+$ region PR is not essential and it may not be provided. Thereafter, photoresist pattern PR1A is removed, for example, through ashing or the like.

Figure 6:
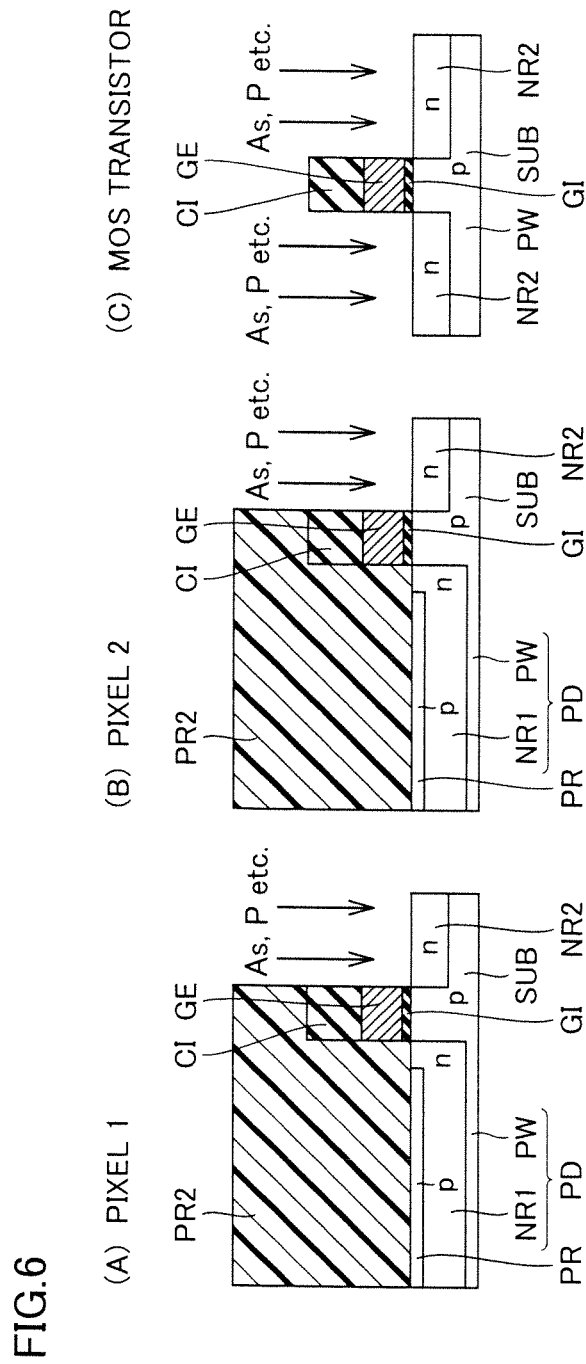
FIG. 6 is a schematic cross-sectional view showing a fourth step in the method of manufacturing a solid-state image sensing device in Embodiment 1 of the present invention.

Referring to FIG. 6, using the normal photolithography technique, a photoresist pattern PR2 is formed on the surface of semiconductor substrate SUB. This photoresist pattern PR2 is formed to provide an opening on a region to serve as a source/drain of the MOS transistor and to cover respective photodiodes PD of pixel 1 and pixel 2. Using this photoresist pattern PR2 as a mask, ions, for example, of As, P, or the like are implanted into the surface of semiconductor substrate SUB, with such methodologies as oblique implantation, rotating implantation, or the like. As a result of this ion implantation, an n-type LDD (Lightly Doped Drain) region NR2 is formed in the surface of semiconductor substrate SUB.

This LDD region NR2 may be formed in both of the source region and the drain region, however, it should be formed at least only in the drain region. Thereafter, photoresist pattern PR2 is removed, for example, through ashing or the like.

Figure 7:
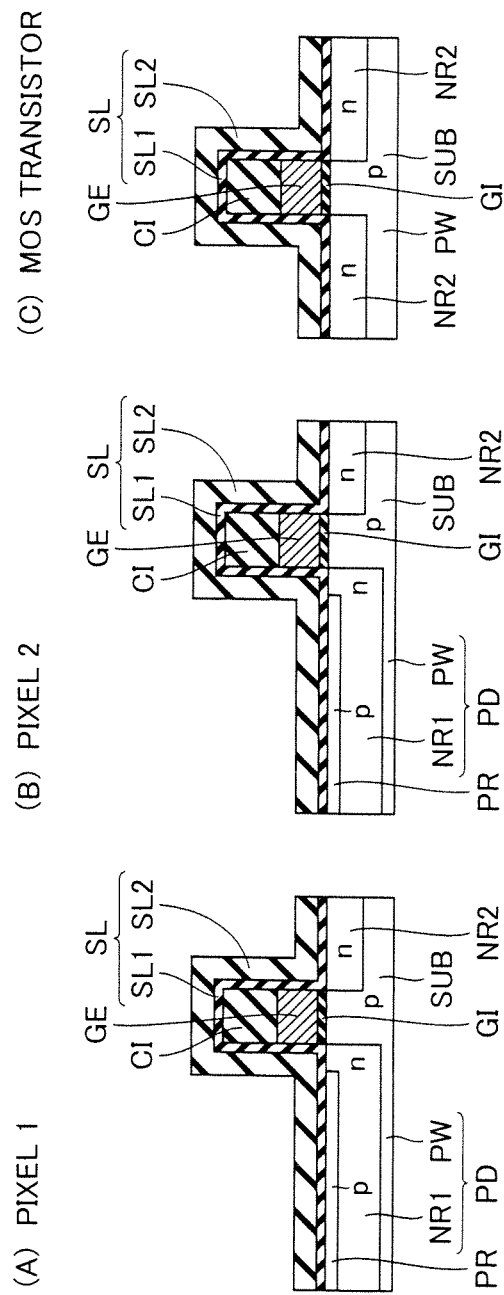
FIG. 7 is a schematic cross-sectional view showing a fifth step in the method of manufacturing a solid-state image sensing device in Embodiment 1 of the present invention.
Figure 11:
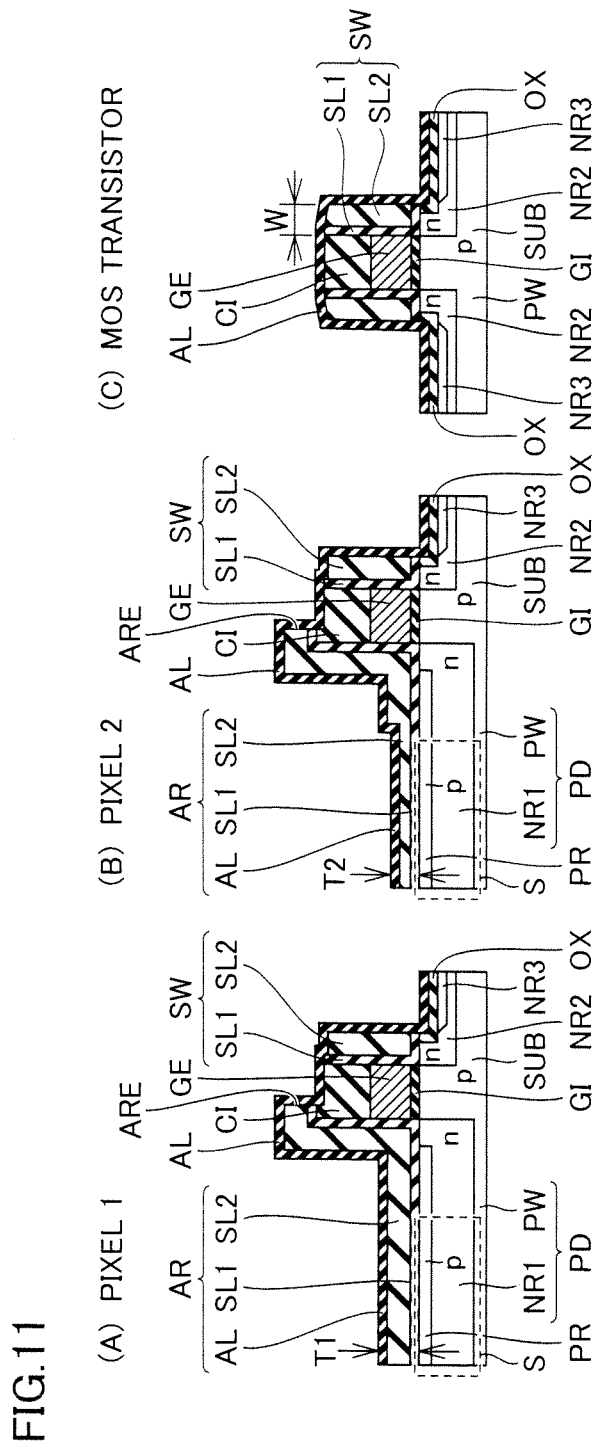
FIG. 11 is a schematic cross-sectional view showing a ninth step in the method of manufacturing a solid-state image sensing device in Embodiment 1 of the present invention.

Referring to FIG. 7, a stack film SL is formed on the entire surface of semiconductor substrate SUB. This stack film SL is a film serving as both of a lower film of an antireflection coating (a lower antireflection coating) and a sidewall by being patterned in a subsequent step. This stack film SL has such a construction that a lower insulating film SL1 formed, for example, from a silicon nitride film and an upper insulating film SL2 formed, for example, from a silicon oxide film are stacked. A thickness of this stack film SL as a whole is set to a thickness corresponding to a width W of a sidewall formed in a subsequent step (FIG. 11). Therefore, in a case where a sidewall has width W, for example, from 150 to 300 nm, lower insulating film SL1 has a thickness, for example, from 50 to 100 nm and upper insulating film SL2 has a thickness, for example, from 100 to 200 nm.

Figure 8:
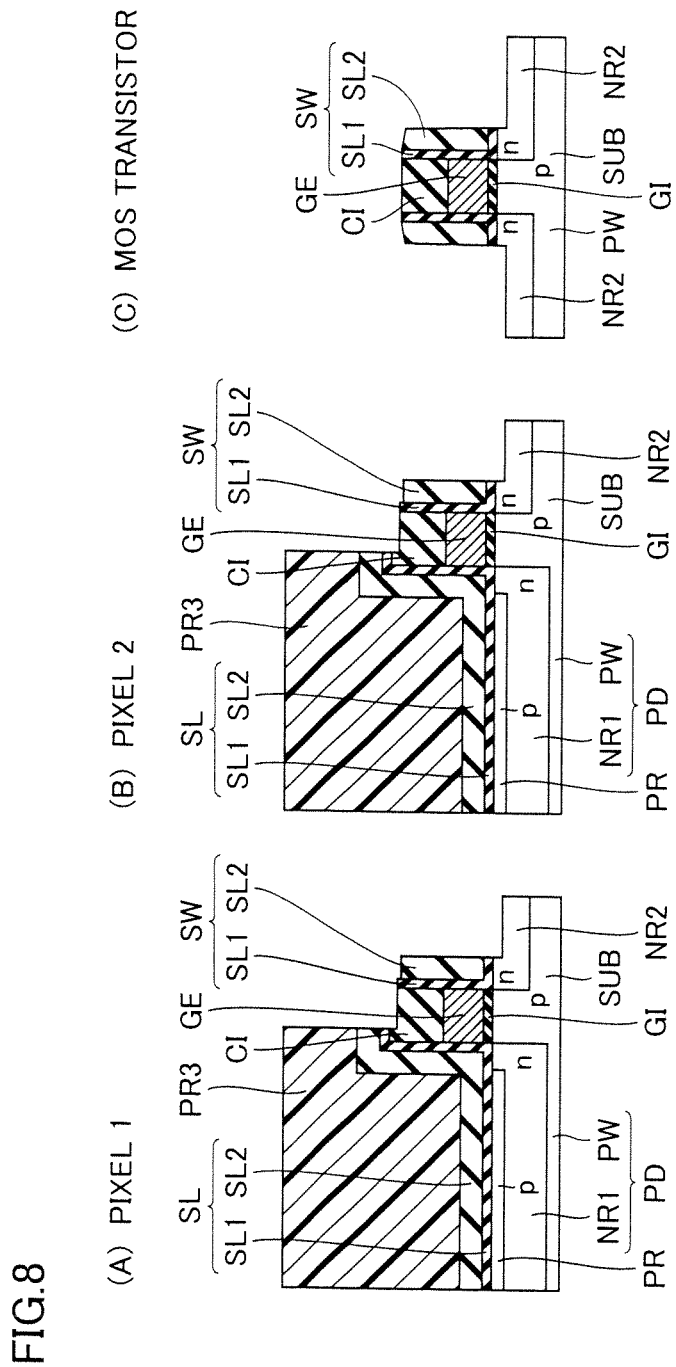
FIG. 8 is a schematic cross-sectional view showing a sixth step in the method of manufacturing a solid-state image sensing device in Embodiment 1 of the present invention.

Referring to FIG. 8, using the normal photolithography technique, a photoresist pattern PR3 is formed on the surface of semiconductor substrate SUB. This photoresist pattern PR3 is formed to cover respective photodiodes PD of pixel 1 and pixel 2 and to provide an opening on the MOS transistor. Using this photoresist pattern PR3 as a mask, stack film SL is anisotropically etched. Etching is performed at least until the surface of semiconductor substrate SUB and a surface of cap insulating film CI are exposed.

As a result of this etching, stack film SL remains to cover a sidewall of gate electrode layer GE to serve as sidewall SW. In addition, stack films SL left on respective photodiodes PD of pixel 1 and pixel 2 serve as the lower antireflection coatings. Namely, as a result of etching of stack film SL, sidewall SW and lower antireflection coating SL are simultaneously formed in the same manufacturing step. Thereafter, photoresist pattern PR3 is removed, for example, through ashing or the like.

Figure 9:
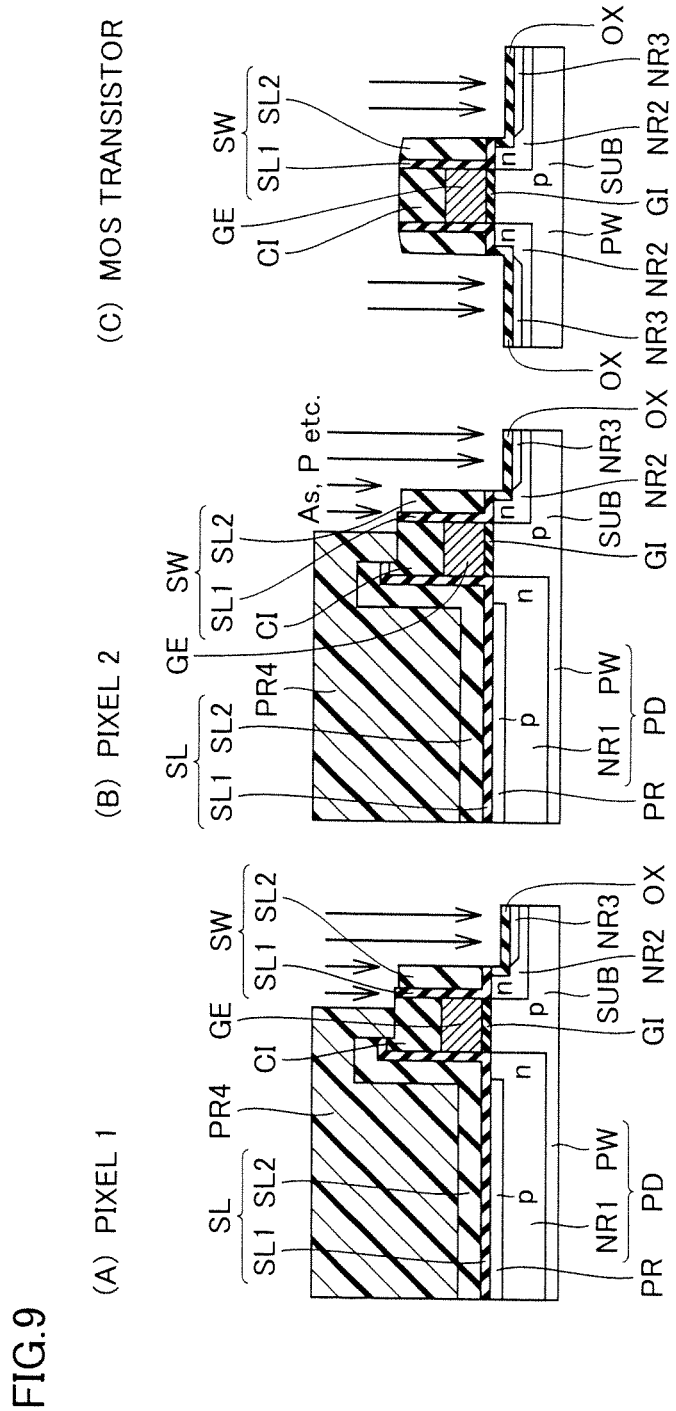
FIG. 9 is a schematic cross-sectional view showing a seventh step in the method of manufacturing a solid-state image sensing device in Embodiment 1 of the present invention.

Referring to FIG. 9, using the normal photolithography technique, a photoresist pattern PR4 is formed on the surface of semiconductor substrate SUB. This photoresist pattern PR4 is formed to cover respective photodiodes PD of pixel 1 and pixel 2 and to provide an opening on the MOS transistor. Using this photoresist pattern PR4, gate electrode layer GE, sidewall SW, and the like as a mask, ions, for example, of As, P, or the like are implanted into the surface of semiconductor substrate SUB. It is noted that, prior to ion implantation, an insulating film OX formed, for example, from a silicon oxide film is formed on the exposed surface of semiconductor substrate SUB.

As a result of this ion implantation, an n-type region NR3 serving as a source/drain region is formed in the surface of semiconductor substrate SUB. Thus, the MOS transistor having LDD region NR2, source/drain region NR3, and gate electrode layer GE is formed. Thereafter, photoresist pattern PR4 is removed, for example, through ashing or the like.

Figure 10:
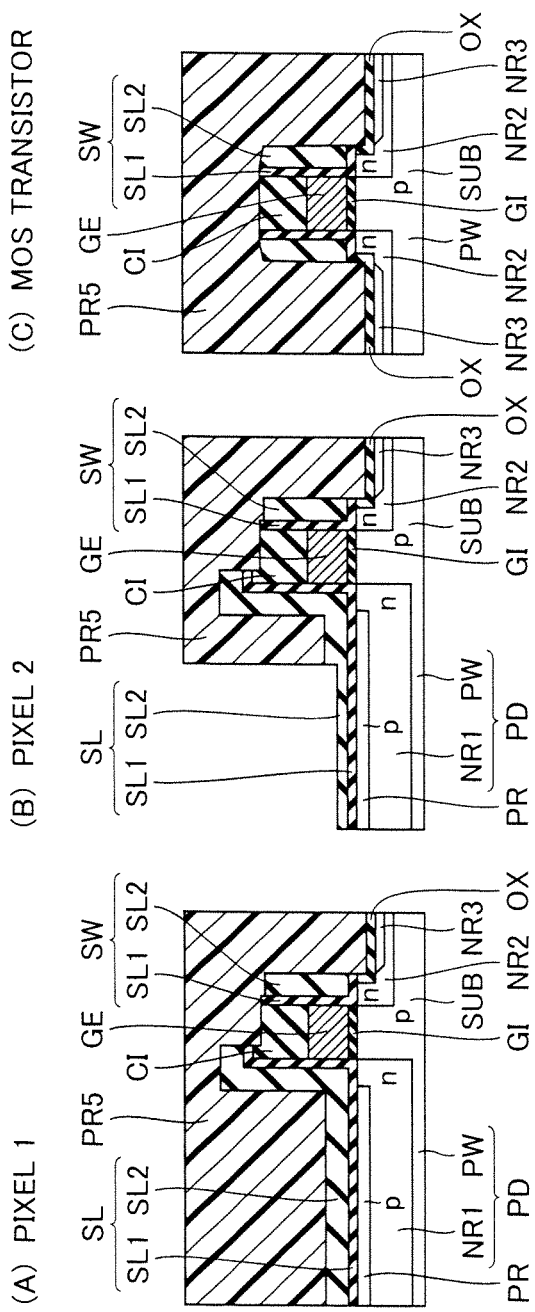
FIG. 10 is a schematic cross-sectional view showing an eighth step in the method of manufacturing a solid-state image sensing device in Embodiment 1 of the present invention.

Referring to FIG. 10, using the normal photolithography technique, a photoresist pattern PR5 is formed on the surface of semiconductor substrate SUB. This photoresist pattern PR5 is foamed to cover photodiode PD of pixel 1 and the MOS transistor and to provide an opening on photodiode PD of pixel 2. Using this photoresist pattern PR5 as a mask, lower antireflection coating SL of pixel 2 is anisotropically etched. Thus, a thickness of lower antireflection coating SL of pixel 2 is controlled to be smaller than a thickness of lower antireflection coating SL of pixel 1.

Etching above is performed, for example, to remove only a part of a thickness of upper insulating film SL2. It is noted that etching may be performed to remove the whole thickness of upper insulating film SL2 or to remove only a part of a thickness of lower insulating film SL1 after removing the whole thickness of upper insulating film SL2. Thereafter, photoresist pattern PR5 is removed, for example, through ashing or the like.

Referring to FIG. 11, an insulating film AL implementing an upper film of the antireflection coating (an upper antireflection coating) is formed on the entire surface of semiconductor substrate SUB. This insulating film AL is formed, for example, from a silicon nitride film having a thickness of 30 nm. Lower antireflection coating SL and insulating film (upper antireflection coating) AL form antireflection coating (first film) AR on photodiode PD of each of pixel 1 and pixel 2.

A portion in insulating film AL above, which is not necessary for an operation of the transistor, such as a contact portion of source/drain region NR3, a contact portion of gate electrode layer GE, and the like, is removed through the normal photolithography technique and etching technique.

Through the steps above, the solid-state image sensing device in the present embodiment is formed.

A construction of antireflection coating AR, sidewall SW, and the like in the solid-state image sensing device in the present embodiment formed with the manufacturing method above will now be described.

Referring to FIG. 11, in the solid-state image sensing device in the present embodiment, colors of light of which images are sensed by pixel 1 and pixel 2 are different from each other. In both of pixel 1 and pixel 2, a pn junction portion between n-type region NR1 and p-type well region PW in region S in semiconductor substrate SUB is a portion functioning as photodiode PD. Antireflection coating AR is formed on each of these photodiodes PD.

In each of pixel 1 and pixel 2, antireflection coating AR has a three-layered structure in which lower insulating film SL1, upper insulating film SL2, and upper antireflection coating AL are stacked. Antireflection coating AR of pixel 1 and antireflection coating AR of pixel 2 have structures different from each other (film thickness, film quality, etc.).

In the present embodiment, a thickness T1 of antireflection coating AR of pixel 1 is greater than a thickness T2 of antireflection coating AR of pixel 2. Specifically, pixel 1 and pixel 2 are equal to each other in thickness of lower insulating film SL1 and pixel 1 and pixel 2 are also equal to each other in thickness of upper antireflection coating AL, however, upper insulating film SL2 of pixel 1 is thicker than upper insulating film SL2 of pixel 2.

So long as antireflection coating AR of pixel 1 and antireflection coating AR of pixel 2 have structures different from each other (film thickness, film quality, etc.), the structure is not limited to the structure above.

A thickness of antireflection coating AR in at least one pixel is greater than a width of sidewall SW. In the present embodiment, thickness T1 of antireflection coating AR of pixel 1 is greater than width W of sidewall SW of the MOS transistor. In addition, thickness T2 of antireflection coating AR of pixel 2 may be greater or smaller than width W of sidewall SW of the MOS transistor.

Since lower antireflection coating SL is formed simultaneously with sidewall SW by anisotropically etching stack films SL1 and SL2, it has an end surface ARE having a pattern produced in anisotropic etching. Since upper antireflection coating AL is formed on lower antireflection coating SL after anisotropic etching, it is formed to cover end surface ARE of lower antireflection coating SL.

The MOS transistor has a pair of source/drain regions NR3 formed at a distance from each other in the surface of semiconductor substrate SUB, LDD region NR2 formed around each of the pair of source/drain regions NR3, and gate electrode layer GE formed on the region lying between the pair of source/drain regions NR3 with gate insulating film GI being interposed.

Sidewall SW is formed to cover the sidewall of gate electrode layer GE. This sidewall SW has such a construction that two layers of lower insulating film SL1 and upper insulating film SL2 are stacked. Lower insulating film SL1 has an L shape in the cross-sectional view in FIG. 11, and upper insulating film SL2 is formed on lower insulating film SL1. Insulating film AL is formed to cover at least the sidewall of sidewall SW.

A function and effect of the solid-state image sensing device in the present embodiment will now be described.

According to the present embodiment, a thickness of stack film SL determines width W of sidewall SW and a thickness of lower antireflection coating SL and upper antireflection coating AL determines thickness T1, T2 of antireflection coating AR. Therefore, width W of sidewall SW and thickness T1, T2 of antireflection coating AR can independently be controlled. Thus, even though width W of sidewall SW becomes smaller under the scaling law, thickness T1 of antireflection coating AR can be equal to or greater than width W of sidewall SW and adaptation to reduction in size is facilitated.

In addition, after sidewall SW and lower antireflection coating SL are formed from stack films SL1 and SL2, upper antireflection coating AL is formed on lower antireflection coating SL. Therefore, restrictions in connection with antireflection coating AR are lessened as compared with a case where antireflection coating AR and sidewall SW are formed in the same step.

Further, after sidewall SW and lower antireflection coating SL are formed from stack films SL1 and SL2, upper antireflection coating AL is formed and at least any of lower antireflection coating SL and upper antireflection coating AL is removed. Therefore, antireflection coatings AR can be fabricated to different thicknesses in respective ones of the plurality of pixels PX without affecting width W of sidewall SW. Therefore, an antireflection effect can be optimized for each pixel PX.

Embodiment 2

In Embodiment 1 above, a method of etching lower antireflection coating SL for varying a thickness of antireflection coating AR of each of pixel 1 and pixel 2 has been described, however, a thickness of antireflection coating AR of each of pixel 1 and pixel 2 may be varied by etching upper antireflection coating AL.

A method of varying a thickness of antireflection coating AR of each of pixel 1 and pixel 2 by etching the upper antireflection coating will be described hereinafter as the present embodiment mainly with reference to FIGS. 12 to 19.

In the present embodiment, a method of manufacturing both of pixel 1 and pixel 2 initially goes through the steps the same as those for pixels 1 and 2 shown in FIGS. 3(B) to 11(B). In addition, a method of manufacturing a MOS transistor in the present embodiment initially goes through the steps the same as those for the MOS transistor shown in FIGS. 3(C) to 11(C).

Figure 12:
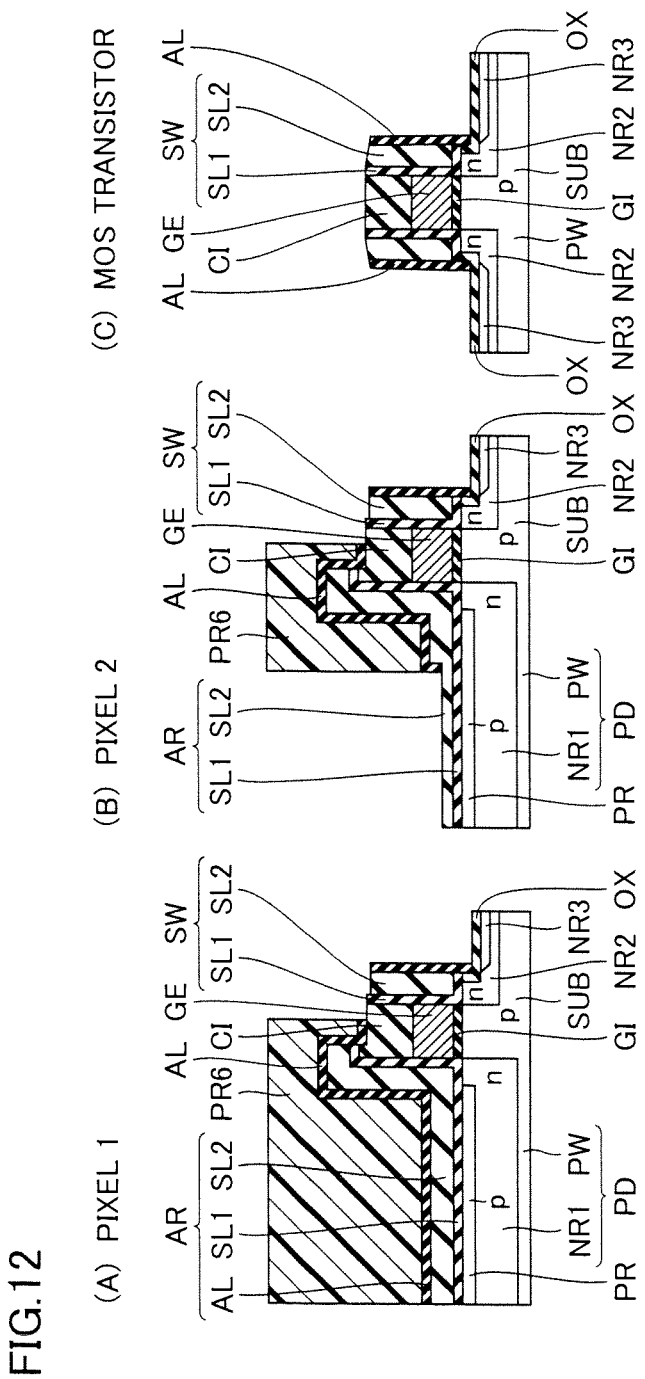
FIG. 12 is a schematic cross-sectional view showing a first step in a method of manufacturing a solid-state image sensing device in Embodiment 2 of the present invention.

Thereafter, referring to FIG. 12, using the normal photolithography technique, a photoresist pattern PR6 is formed on the surface of semiconductor substrate SUB. This photoresist pattern PR6 is formed to cover photodiode PD of pixel 1 and to provide openings on photodiode PD of pixel 2 and the MOS transistor respectively. Using this photoresist pattern PR6 as a mask, upper antireflection coating AL of pixel 2 is anisotropically etched. Thus, a thickness of antireflection coating AR of pixel 2 is controlled to be smaller than a thickness of antireflection coating AR of pixel 1. Though a case where an end of photoresist pattern PR6 is located on gate electrode GE in pixel 1 is shown in FIG. 12(A), the gate is effectively located high in this case. In general, in an image sensing element, a thinner film between contact layers is desirable in order to prevent vignetting, and hence the gate is also preferably located low. Therefore, the end of photoresist pattern PR6 may not be located on the gate so that the antireflection coating on the gate is etched. This is also the case with pixel 2 in FIG. 12(B), and in this case, it is not necessary to provide photoresist pattern PR6.

Etching above is performed, for example, to remove the whole thickness of upper antireflection coating AL. It is noted that etching may be performed to remove only a part of the thickness of upper antireflection coating AL or to remove only a part of a thickness of lower antireflection coating SL after removing the whole thickness of upper antireflection coating AL.

In a case where the whole thickness of upper antireflection coating AL is removed in this etching, upper antireflection coating AL remains only on the sidewall of sidewall SW except for a portion covered with photoresist pattern PR6.

Figure 13:
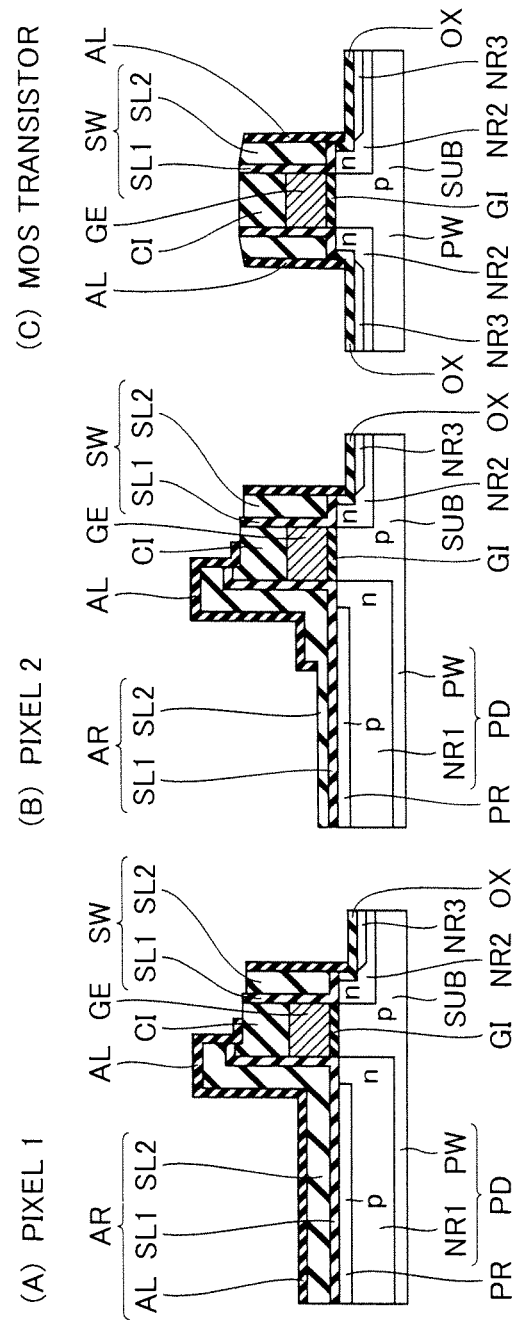
FIG. 13 is a schematic cross-sectional view showing a second step in the method of manufacturing a solid-state image sensing device in Embodiment 2 of the present invention.

Referring to FIG. 13, thereafter, photoresist pattern PR6 is removed, for example, through ashing or the like.

Figure 14:
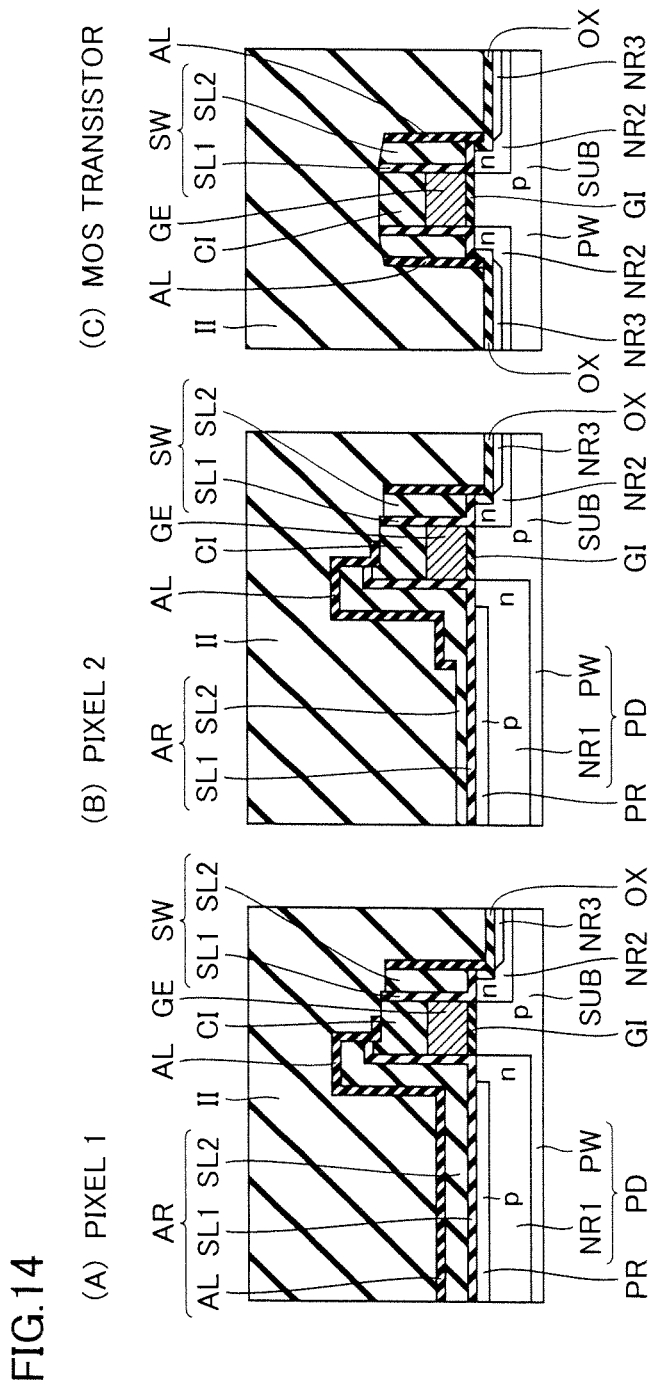
FIG. 14 is a schematic cross-sectional view showing a third step in the method of manufacturing a solid-state image sensing device in Embodiment 2 of the present invention.

Referring to FIG. 14, an interlayer insulating film II is formed on the entire surface of semiconductor substrate SUB so as to cover photodiode PD and the MOS transistor. This interlayer insulating film II is formed from a silicon oxide film made, for example, of TEOS as a source material, and it has a flat upper surface by being subjected to such planarization processing as CMP (Chemical Mechanical Polishing).

Figure 15:
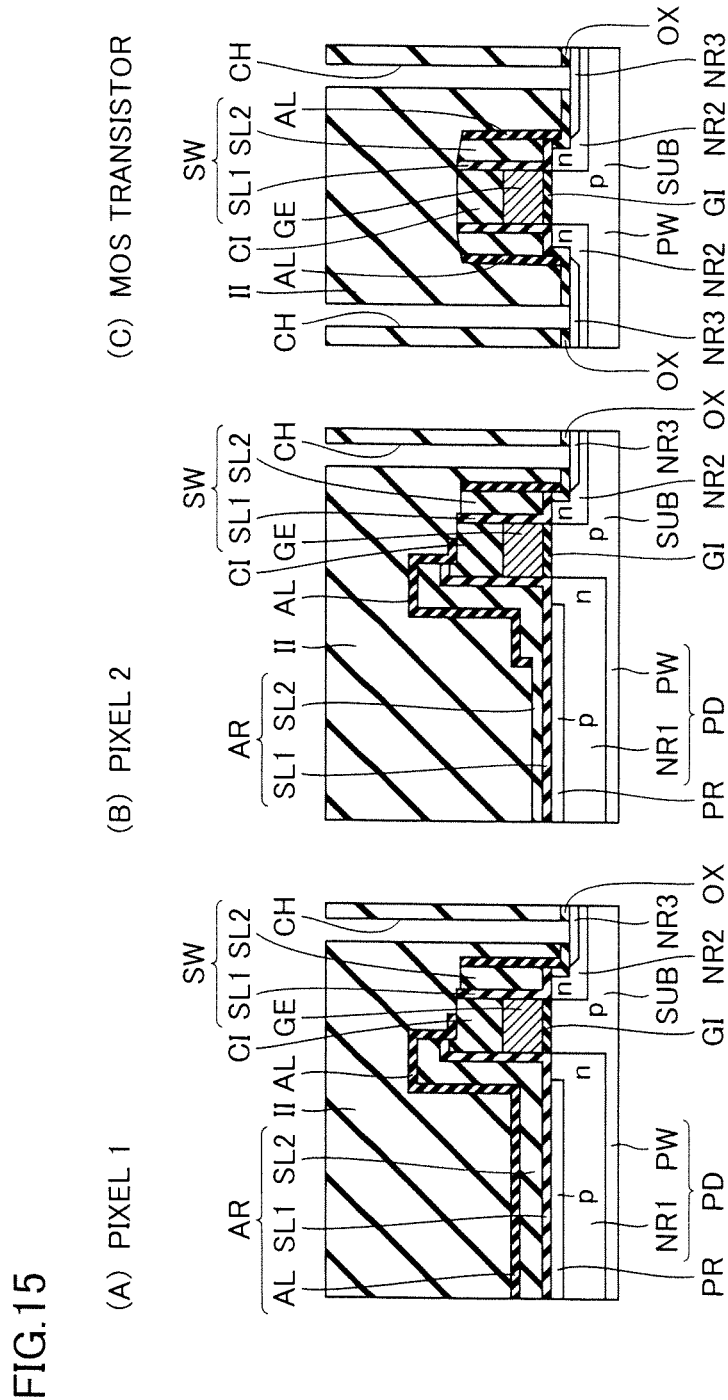
FIG. 15 is a schematic cross-sectional view showing a fourth step in the method of manufacturing a solid-state image sensing device in Embodiment 2 of the present invention.

Referring to FIG. 15, using the normal photolithography technique and etching technique, a contact hole CH passing through interlayer insulating film II and insulating film OX to reach source/drain region NR3 is formed in interlayer insulating film II.

Figure 16:
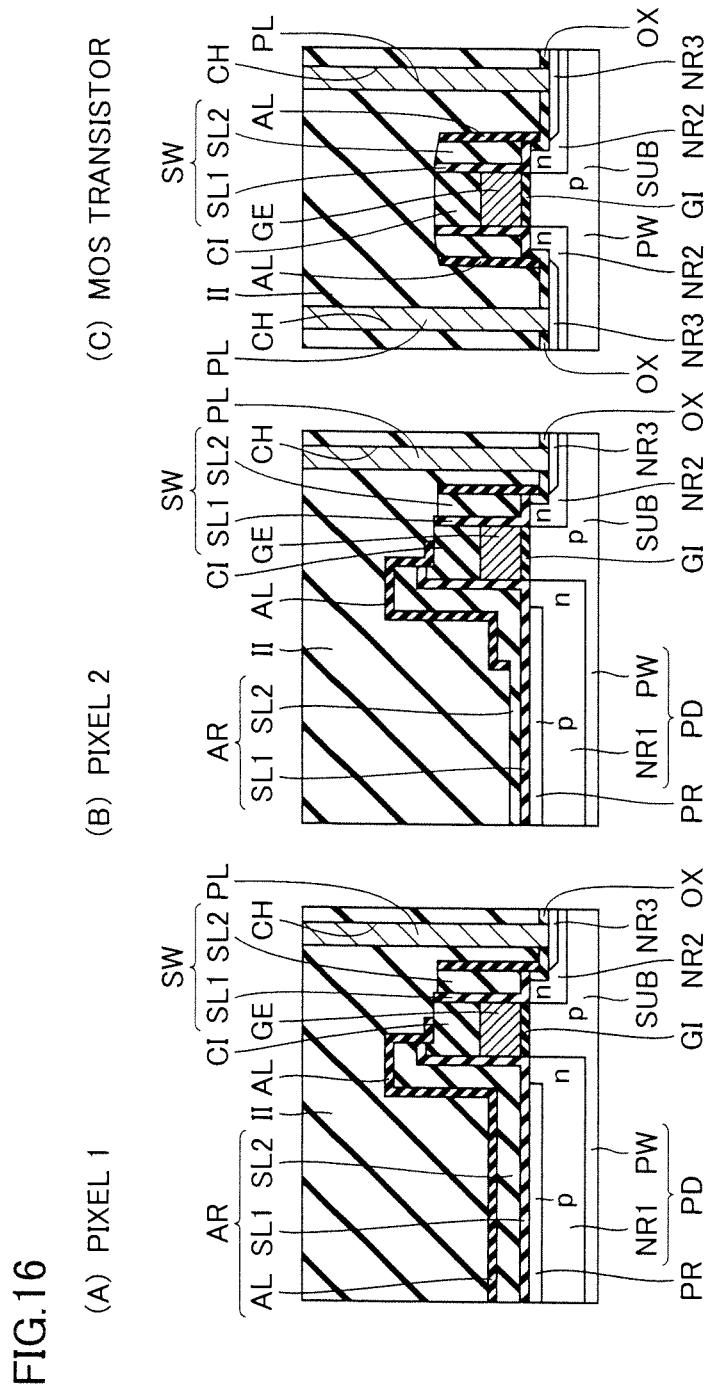
FIG. 16 is a schematic cross-sectional view showing a fifth step in the method of manufacturing a solid-state image sensing device in Embodiment 2 of the present invention.

Referring to FIG. 16, a contact plug PL composed, for example, of tungsten is formed to bury this contact hole CH.

Figure 17:
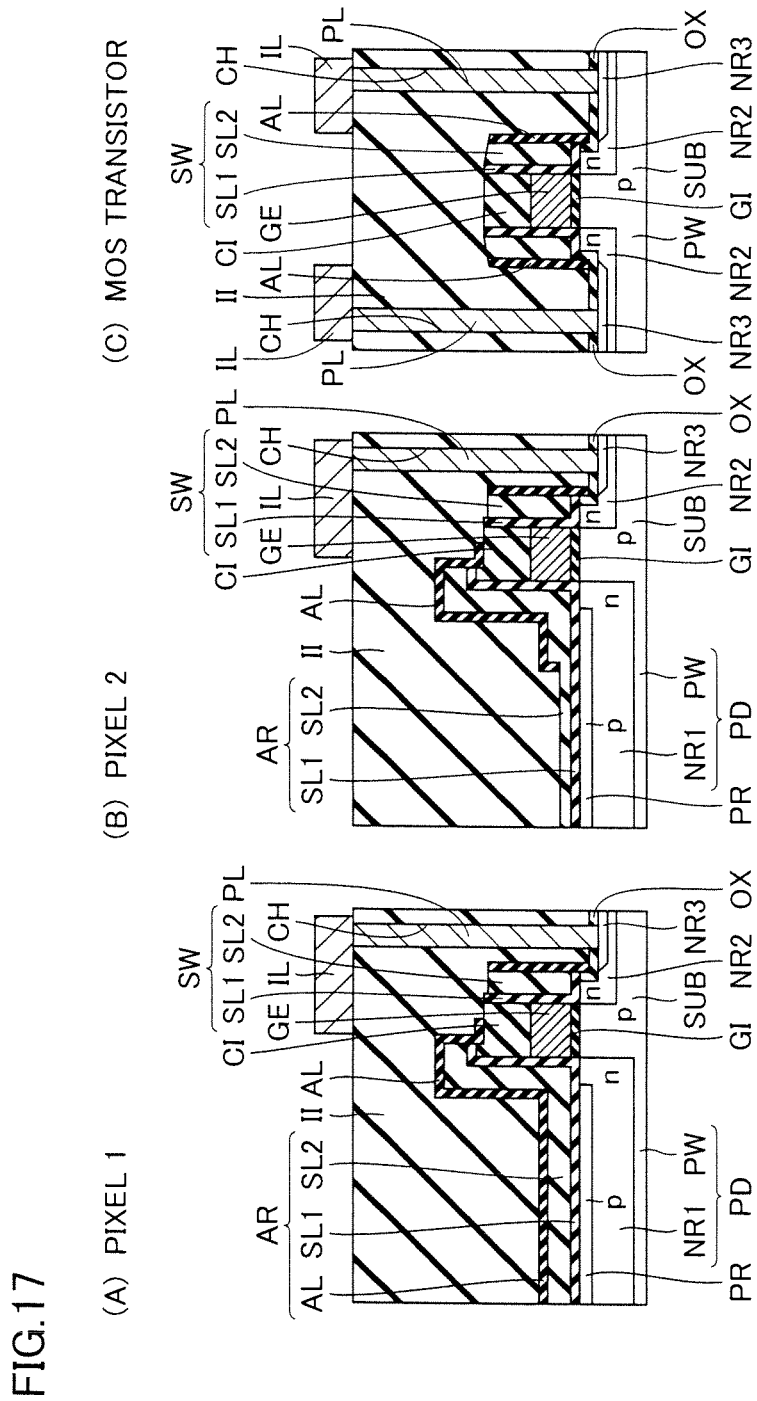
FIG. 17 is a schematic cross-sectional view showing a sixth step in the method of manufacturing a solid-state image sensing device in Embodiment 2 of the present invention.

Referring to FIG. 17, an interconnection layer IL composed, for example, of aluminum, copper or the like is formed on interlayer insulating film II to electrically be connected to source/drain region NR3 through contact plug PL.

Figure 18:
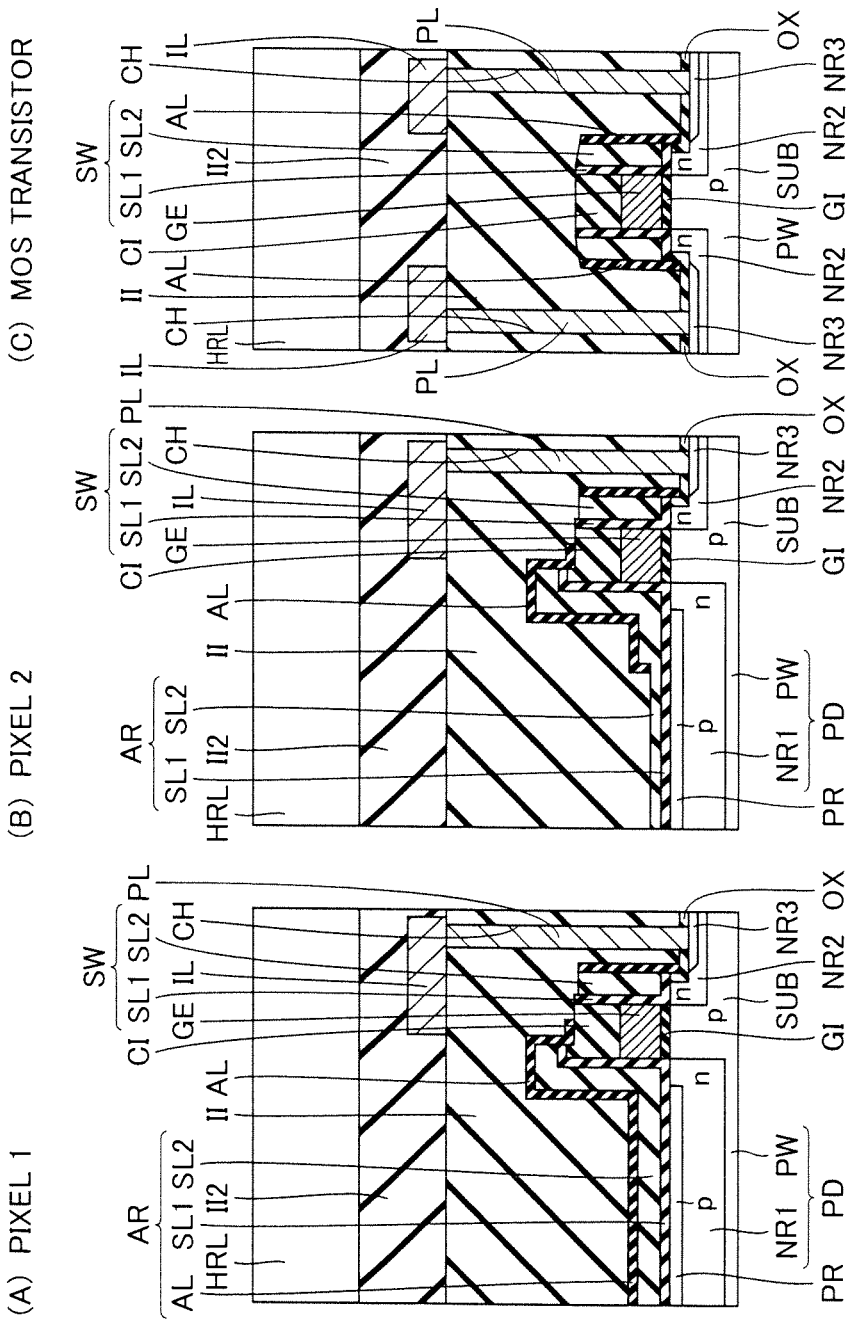
FIG. 18 is a schematic cross-sectional view showing a seventh step in the method of manufacturing a solid-state image sensing device in Embodiment 2 of the present invention.

Referring to FIG. 18, an interlayer insulating film II2 is formed on interlayer insulating film II to cover interconnection layer IL. A high-refraction-index film HRL for lens is formed on this interlayer insulating film II2. Thereafter, high-refraction-index film HRL is worked.

Figure 19:
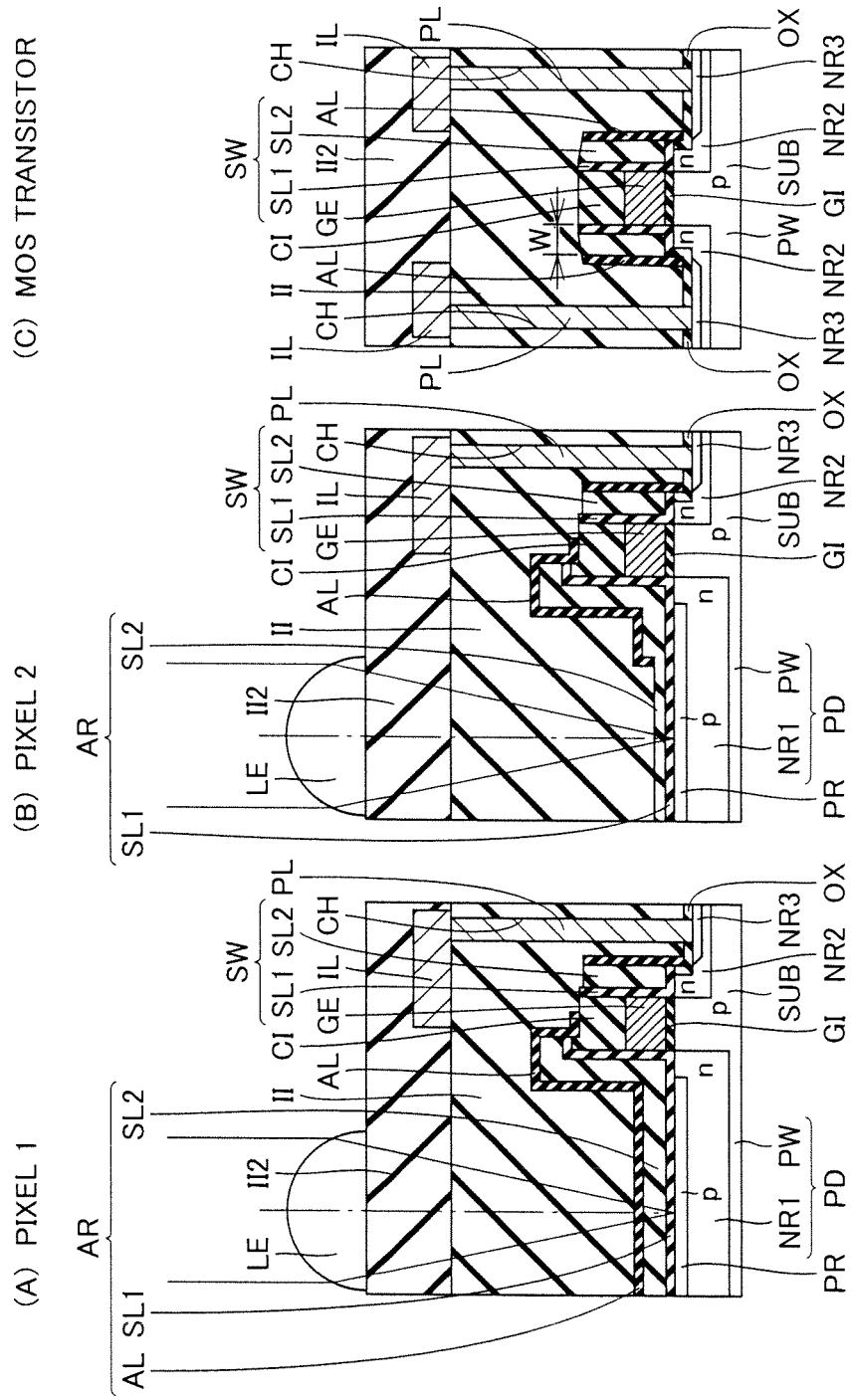
FIG. 19 is a schematic cross-sectional view showing an eighth step in the method of manufacturing a solid-state image sensing device in Embodiment 2 of the present invention.

Referring to FIG. 19, as high-refraction-index film HRL above is worked, a lens LE is formed from high-refraction-index film HRL. Thus, the solid-state image sensing device in the present embodiment is manufactured.

A construction of the antireflection coating, the sidewall, and the like in the solid-state image sensing device in the present embodiment formed with the manufacturing method above will now be described.

Referring to FIG. 19, in the present embodiment, antireflection coating AR of pixel 1 is greater in thickness than antireflection coating AR of pixel 2. Specifically, antireflection coating AR of pixel 1 has a three-layered structure in which lower insulating film SL1, upper insulating film SL2 and upper antireflection coating AL are stacked. Meanwhile, antireflection coating AR of pixel 2 has a two-layered structure in which lower insulating film SL1 and upper insulating film SL2 are stacked.

It is noted that antireflection coating AR of pixel 2 may have a single-layered structure of lower insulating film SL1, or it may have a three-layered structure in which lower insulating film SL1, upper insulating film SL2 and upper antireflection coating AL are stacked and upper antireflection coating AL is smaller in thickness than upper antireflection coating AL of pixel 1.

A thickness of antireflection coating AR in at least one pixel is greater than a width of sidewall SW. In the present embodiment, the thickness of antireflection coating AR of pixel 1 is greater than width W of sidewall SW of the MOS transistor. In addition, thickness T2 of antireflection coating AR of pixel 2 may be greater or smaller than width W of sidewall SW of the MOS transistor.

In addition, interlayer insulating film II formed, for example, from a silicon oxide film is formed on the surface of semiconductor substrate SUB so as to cover photodiode PD and the MOS transistor. Contact hole CH reaching source/drain region NR3 is formed in interlayer insulating film II and insulating film OX. Contact plug PL composed, for example, of tungsten is formed to bury contact hole CH.

Interconnection layer IL composed, for example, of aluminum, copper or the like is formed on interlayer insulating film II to electrically be connected to source/drain region NR3 through contact plug PL. Interlayer insulating film II2 formed, for example, from a silicon oxide film is formed on interlayer insulating film II so as to cover interconnection layer IL. Lens LE formed from high-refraction-index film HRL is formed on this interlayer insulating film II2. This lens LE serves to condense light for irradiation of photodiode PD.

Since the construction is otherwise substantially the same as in Embodiment 1 shown in FIG. 11, the same elements have the same reference characters allotted and description thereof will not be provided.

The construction in Embodiment 1 shown in FIG. 11 also has interlayer insulating films II, II2, contact hole CH, contact plug PL, interconnection layer IL, and lens LE, as in the construction in the present embodiment shown in FIG. 19.

According to the present embodiment, since additional upper antireflection coating AL is formed after the sidewall is formed in a plurality of pixels, a function and effect the same as in Embodiment 1 can be obtained.

In addition, according to the present embodiment, not only the thickness of lower antireflection coating SL but also the thickness of upper antireflection coating AL can be controlled in pixel 2, and hence optimization of the antireflection effect for each pixel is further facilitated.

Embodiment 3

In the present embodiment, a solid-state image sensing device having an R pixel (a first pixel), a G pixel (a second pixel), and a B pixel (a third pixel) as a plurality of pixels as well as a MOS transistor will be described. Initially, a method of manufacturing the solid-state image sensing device in the present embodiment will be described mainly with reference to FIGS. 20 to 23.

The R pixel shown in (A) in each of FIGS. 20 to 23 corresponds, for example, to the cross-section along the line IIIA-IIIA in FIG. 1, and the G pixel shown in (B) in each of FIGS. 20 to 23 corresponds, for example, to the cross-section along the line IIIB-IIIB in FIG. 1. In addition, the B pixel shown in (C) in each of FIGS. 20 to 23 corresponds, for example, to a cross-section along the line XXC-XXC in FIG. 1, and the MOS transistor shown in (D) in each of FIGS. 20 to 23 corresponds, for example, to the cross-section along the line IIIC-IIIC in FIG. 1.

Figure 20:
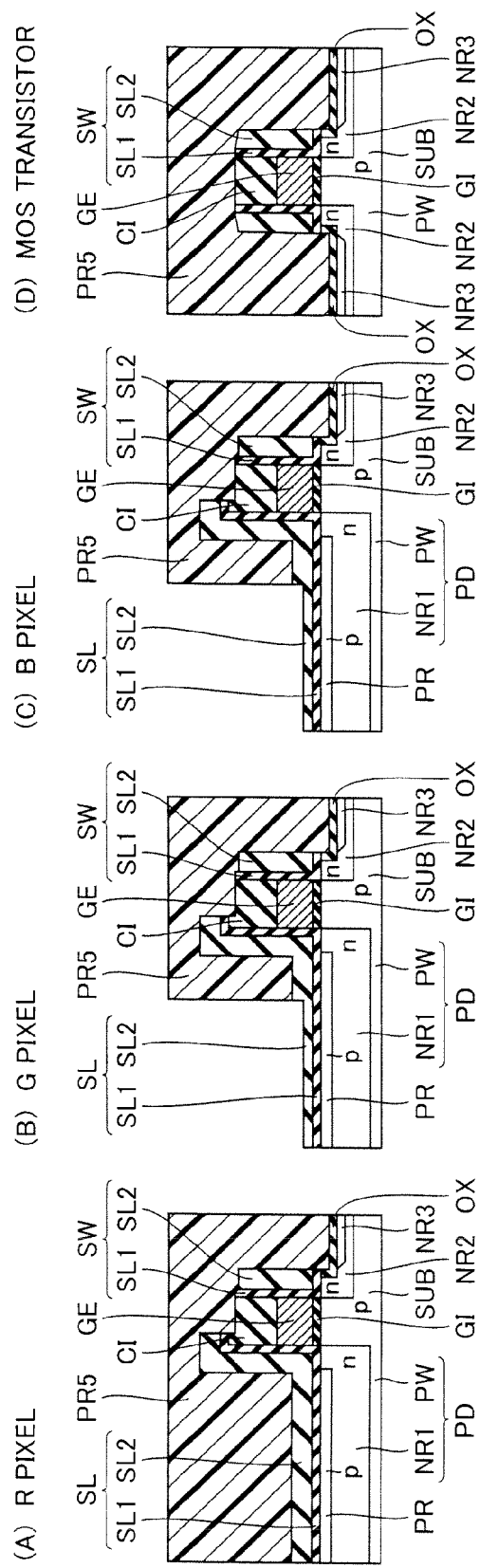
FIG. 20 is a schematic cross-sectional view showing a first step in a method of manufacturing a solid-state image sensing device in Embodiment 3 of the present invention.

A method of manufacturing the R pixel in the present embodiment initially goes through the steps the same as those for pixel 1 shown in FIGS. 3(A) to 10(A). In addition, a method of manufacturing both of the G pixel and the B pixel goes through the steps the same as those for pixel 2 shown in FIGS. 3(B) to 10(B). Moreover, a method of manufacturing a MOS transistor in the present embodiment goes through the steps the same as those for the MOS transistor shown in FIGS. 3(C) to 10(C). FIG. 20 shows a state after the steps so far are completed.

Table 1 below shows a thickness of lower insulating film SL1 and a thickness of upper insulating film SL2 formed in each of the R pixel, the G pixel, and the B pixel in the step in FIG. 7 above. In Table 1, lower insulating film SL1 is denoted, for example, as "lower layer SiN" as a silicon nitride film, and upper insulating film SL2 is denoted, for example, as "intermediate layer TEOS" as a silicon oxide film formed of TEOS (Tetra Ethyl Ortho Silicate) as a source material. Further, "upper layer SiN" in Table 1 refers to upper antireflection coating AL formed, for example, from a silicon nitride film, however, it has not yet been formed in the step in FIG. 7 and therefore a thickness thereof is 0 nm.

In the step in FIG. 7, the sum of thicknesses of lower layer SiN and intermediate layer TEOS shown in Table 1 is set to be equal to the width of sidewall SW.

TABLE 1

| Structure | R | G | B |
|---|---|---|---|
| Upper Layer SiN | 0 nm | 0 nm | 0 nm |
| Intermediate Layer TEOS | 0 to 300 nm | 0 to 300 nm | 0 to 300 nm |
| Lower Layer SiN | 0 to 300 nm | 0 to 300 nm | 0 to 300 nm |

In addition, Table 2 below shows thicknesses of "lower layer SiN," "intermediate layer TEOS" and "upper layer SiN" formed in each of the R pixel, the G pixel, and the B pixel after lower antireflection coating SL in each of the G pixel and the B pixel is etched in the step in FIG. 10 above.

TABLE 2

| Structure | R | G | B |
|---|---|---|---|
| Upper Layer SiN | 0 nm | 0 nm | 0 nm |
| Intermediate Layer TEOS | 0 to 300 nm | 0 to 250 nm | 0 to 250 nm |
| Lower Layer SiN | 0 to 300 nm | 0 to 300 nm | 0 to 300 nm |

Figure 21:
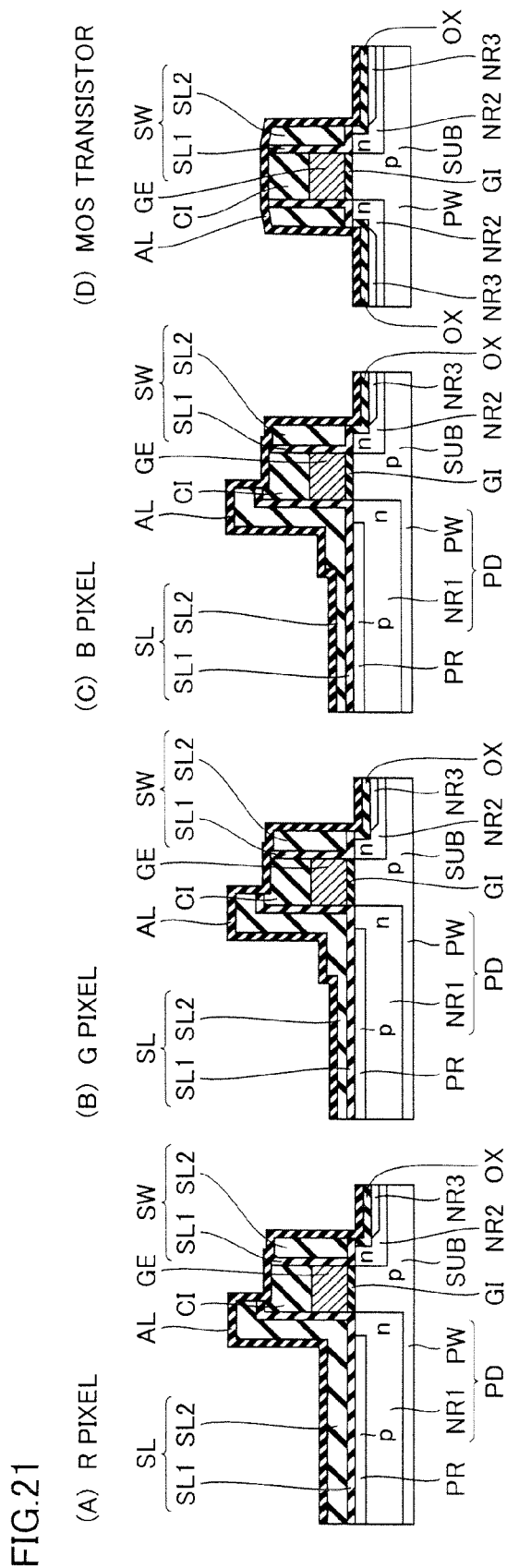
FIG. 21 is a schematic cross-sectional view showing a second step in the method of manufacturing a solid-state image sensing device in Embodiment 3 of the present invention.

Referring to FIG. 21, after photoresist pattern PR5 (FIG. 20) is removed, for example, through ashing or the like, insulating film AL implementing the upper antireflection coating is formed on the entire surface of semiconductor substrate SUB. This insulating film AL is formed, for example, from a silicon nitride film having a thickness from 0 to 100 nm. Table 3 below shows thicknesses of "lower layer SiN," "intermediate layer TEOS" and "upper layer SiN" formed in each of the R pixel, the G pixel, and the B pixel in this state.

TABLE 3

| Structure | R | G | B |
|---|---|---|---|
| Upper Layer SiN | 0 to 100 nm | 0 to 100 nm | 0 to 100 nm |
| Intermediate Layer TEOS | 0 to 300 nm | 0 to 250 nm | 0 to 250 nm |
| Lower Layer SiN | 0 to 300 nm | 0 to 300 nm | 0 to 300 nm |

Figure 22:
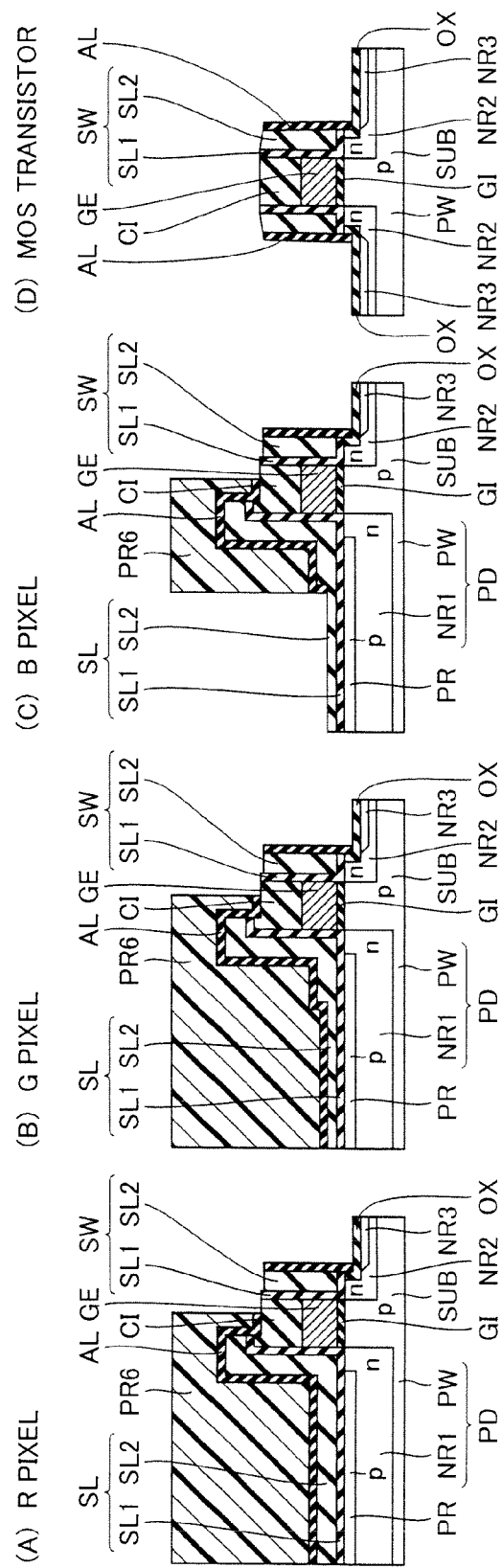
FIG. 22 is a schematic cross-sectional view showing a third step in the method of manufacturing a solid-state image sensing device in Embodiment 3 of the present invention.

Referring to FIG. 22, using the normal photolithography technique, photoresist pattern PR6 is formed on the surface of semiconductor substrate SUB. This photoresist pattern PR6 is formed to cover respective photodiodes PD of the R pixel and the G pixel and to provide openings on photodiode PD of the B pixel and the MOS transistor respectively. Using this photoresist pattern PR6 as a mask, upper antireflection coating AL of the B pixel is anisotropically etched. Upper antireflection coating AL is thus removed in the B pixel and its thickness is decreased. This etching may be performed to allow a part of a thickness of upper antireflection coating AL in the B pixel to remain or may be performed to decrease the thickness of lower antireflection coating SL after upper antireflection coating AL is completely removed.

Though a case where an end of photoresist pattern PR6 is located on gate electrode GE in each of the R pixel and the G pixel in FIGS. 22(A) to 22(B) is shown, the gate is effectively located high in this case. In general, in an image sensing element, a thinner film between contact layers is desirable in order to prevent vignetting, and hence the gate is also preferably located low. Therefore, the end of photoresist pattern PR6 may not be located on the gate so that the antireflection coating on the gate is etched. This is also the case with the B pixel in FIG. 22(C), and in this case, it is not necessary to provide photoresist pattern PR6.

Table 4 below shows thicknesses of "lower layer SiN," "intermediate layer TEOS" and "upper layer SiN" formed in each of the R pixel, the G pixel, and the B pixel in this state.

TABLE 4

| Structure | R | G | B |
|---|---|---|---|
| Upper Layer SiN | 0 to 100 nm | 0 to 100 nm | 0 to 50 nm |
| Intermediate Layer TEOS | 0 to 300 nm | 0 to 250 nm | 0 to 250 nm |
| Lower Layer SiN | 0 to 300 nm | 0 to 300 nm | 0 to 300 nm |

*SW = 0 to 600 nm

Figure 23:
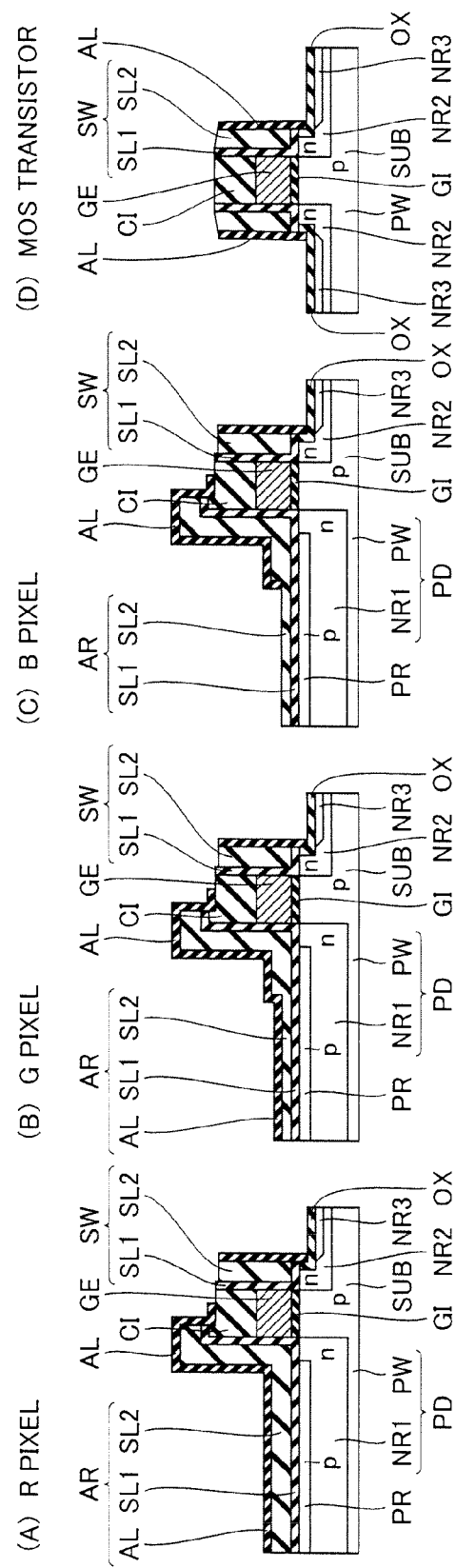
FIG. 23 is a schematic cross-sectional view showing a fourth step in the method of manufacturing a solid-state image sensing device in Embodiment 3 of the present invention.

Thereafter, as photoresist pattern PR6 (FIG. 22) is removed, for example, through ashing or the like, the construction shown in FIG. 23 is obtained. Thereafter, the solid-state image sensing device in the present embodiment is formed by going through the steps substantially the same as in Embodiment 2 shown in FIGS. 14 to 19.

According to the present embodiment, since additional upper antireflection coating AL is formed after sidewall SW is formed in the plurality of pixels PX, a function and effect the same as in Embodiment 1 is obtained. In addition, sidewall SW common to all MOS transistors can be formed and antireflection coating AR optimized for each of the R pixel, the G pixel and the B pixel can be realized in a relatively simplified process.

It is noted that, since a wavelength of each of red light, green light and blue light satisfies relation of red light>green light>blue light, optimal values for the thicknesses of the antireflection coatings formed in the R pixel, the G pixel and the B pixel respectively are also considered to satisfy relation of red light>green light>blue light. In the present embodiment and the following Embodiment 4, the antireflection coatings are formed to satisfy the relation in thickness above.

It is noted that, in a case where relation in thickness among the antireflection coatings of respective pixels different from above is preferred depending on an effect of interference or the like, an antireflection coating satisfying such relation is formed.

Embodiment 4

In the present embodiment, a solid-state image sensing device having an R pixel (a first pixel), a G pixel (a second pixel), and a B pixel (a third pixel) as a plurality of pixels as well as a MOS transistor as in Embodiment 3 will be described. Initially, a method of manufacturing the solid-state image sensing device in the present embodiment will be described mainly with reference to FIGS. 24 to 28.

The R pixel shown in (A) in each of FIGS. 24 to 28 corresponds, for example, to the cross-section along the line IIIA-IIIA in FIG. 1, and the G pixel shown in (B) in each of FIGS. 24 to 28 corresponds, for example, to the cross-section along the line IIIB-IIIB in FIG. 1. In addition, the B pixel shown in (C) in each of FIGS. 24 to 28 corresponds, for example, to the cross-section along the line XXC-XXC in FIG. 1, and the MOS transistor shown in (D) in each of FIGS. 24 to 28 corresponds, for example, to the cross-section along the line IIIC-IIIC in FIG. 1.

Figure 24:
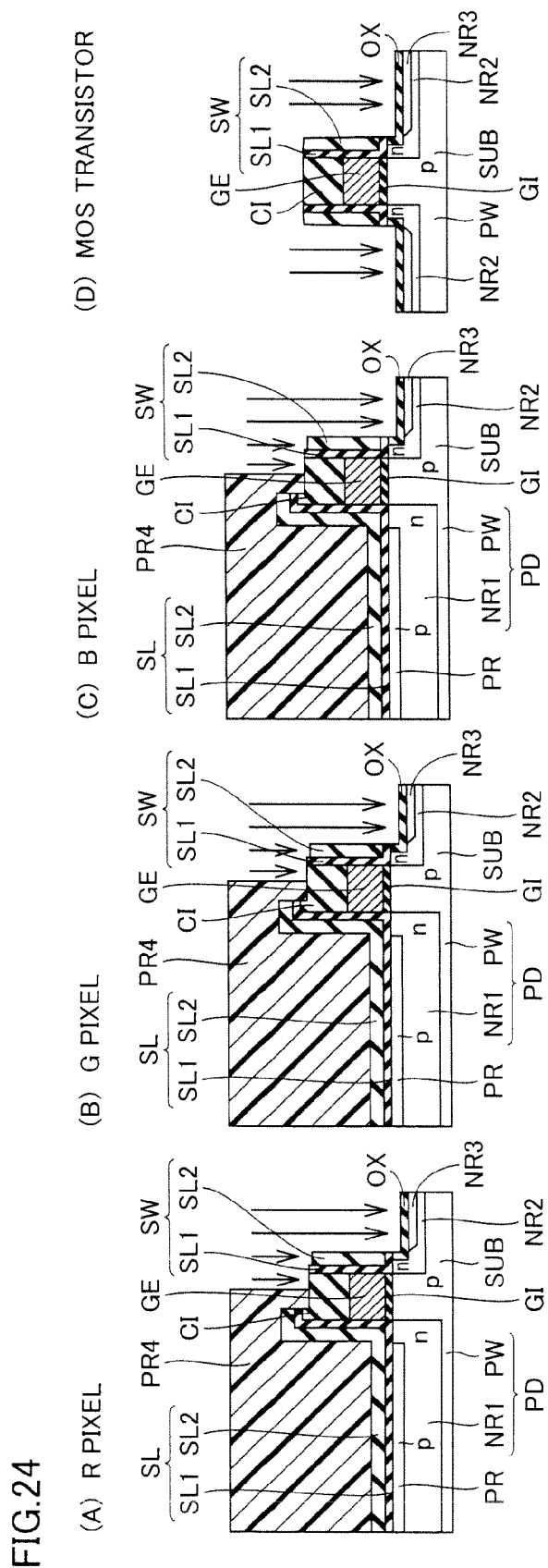
FIG. 24 is a schematic cross-sectional view showing a first step in a method of manufacturing a solid-state image sensing device in Embodiment 4 of the present invention.

A method of manufacturing the R pixel, the G pixel, and the B pixel as well as the MOS transistor in the present embodiment initially goes through the steps the same as shown in FIGS. 3 to 9. FIG. 24 shows a state after the steps so far are completed.

Table 5 below shows a thickness of lower insulating film SL1 and a thickness of upper insulating film SL2 formed in each of the R pixel, the G pixel, and the B pixel in the step in FIG. 7 above. It is noted that denotation as "lower layer SiN" in Table 5 is the same as the denotation of "lower layer SiN" in Tables 1 to 4. A thickness of "intermediate layer TEOS" in Table 5 refers to a total thickness of upper insulating film SL2 of lower antireflection coating SL and a lower insulating film AL1 of upper antireflection coating AL. In addition, a thickness of "upper layer SiN" in Table 5 refers to a thickness of an upper insulating film AL2 of upper antireflection coating AL.

Further, since upper antireflection coating AL has not yet been formed in the step in FIG. 7, the thickness of "intermediate layer TEOS" in Table 5 means only the thickness of upper insulating film SL2 of lower antireflection coating SL and a thickness of "upper layer SiN" is 0 nm.

TABLE 5

| Structure | R | G | B |
| --- | --- | --- | --- |
| Upper Layer SiN | 0 nm | 0 nm | 0 nm |
| Intermediate Layer TEOS | 0 to 100 nm | 0 to 100 nm | 0 to 100 nm |
| Lower Layer SiN | 0 to 300 nm | 0 to 300 nm | 0 to 300 nm |

Figure 25:
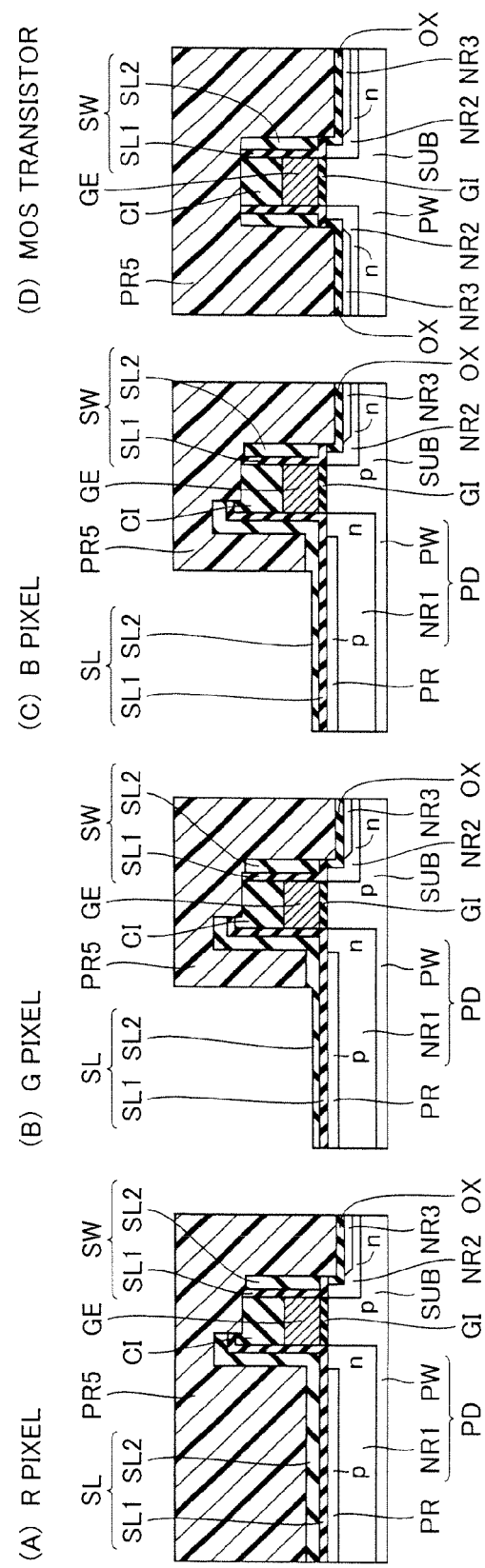
FIG. 25 is a schematic cross-sectional view showing a second step in the method of manufacturing a solid-state image sensing device in Embodiment 4 of the present invention.

Referring to FIG. 25, after photoresist pattern PR4 (FIG. 24) is removed, for example, through ashing or the like, using the normal photolithography technique, photoresist pattern PR5 is formed on the surface of semiconductor substrate SUB. This photoresist pattern PR5 is formed to cover photodiode PD of the R pixel and the MOS transistor and to provide openings on respective photodiodes PD of the G pixel and the B pixel. Using this photoresist pattern PR5 as a mask, lower antireflection coatings SL of the G pixel and the B pixel respectively are anisotropically etched. A part of the thickness of lower antireflection coating SL is thus removed in the G pixel and the B pixel and its thickness is decreased. Thereafter, photoresist pattern PR5 is removed, for example, through ashing or the like.

Table 6 below shows thicknesses of "lower layer SiN," "intermediate layer TEOS" and "upper layer SiN" formed in each of the R pixel, the G pixel, and the B pixel in this state.

TABLE 6

| Structure | R | G | B |
| --- | --- | --- | --- |
| Upper Layer SiN | 0 nm | 0 nm | 0 nm |
| Intermediate Layer TEOS | 0 to 100 nm | 0 to 50 nm | 0 to 50 nm |
| Lower Layer SiN | 0 to 300 nm | 0 to 300 nm | 0 to 300 nm |

Figure 26:
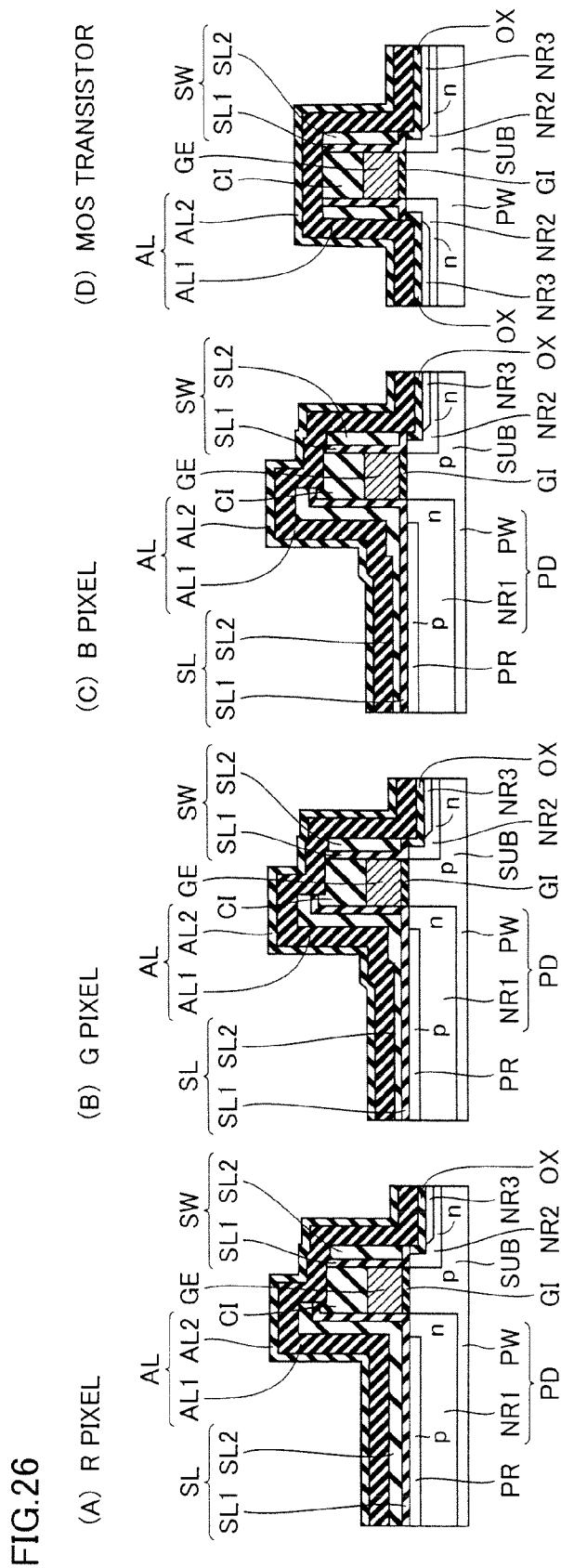
FIG. 26 is a schematic cross-sectional view showing a third step in the method of manufacturing a solid-state image sensing device in Embodiment 4 of the present invention.

Referring to FIG. 26, insulating film AL implementing the upper antireflection coating is formed on the entire surface of semiconductor substrate SUB. This insulating film AL is formed from a stack film of lower insulating film AL1 and upper insulating film AL2. Lower insulating film AL1 is, for example, a silicon oxide film having a thickness from 0 to 200 nm, and upper insulating film AL2 is, for example, a silicon nitride film having a thickness from 0 to 100 nm. Table 7 below shows thicknesses of "lower layer SiN," "intermediate layer TEOS" and "upper layer SiN" formed in each of the R pixel, the G pixel, and the B pixel in this state.

TABLE 7

| Structure | R | G | B |
| --- | --- | --- | --- |
| Upper Layer SiN | 0 to 100 nm | 0 to 100 nm | 0 to 100 nm |
| Intermediate Layer TEOS | 0 to 300 nm | 0 to 250 nm | 0 to 250 nm |
| Lower Layer SiN | 0 to 300 nm | 0 to 300 nm | 0 to 300 nm |

Figure 27:
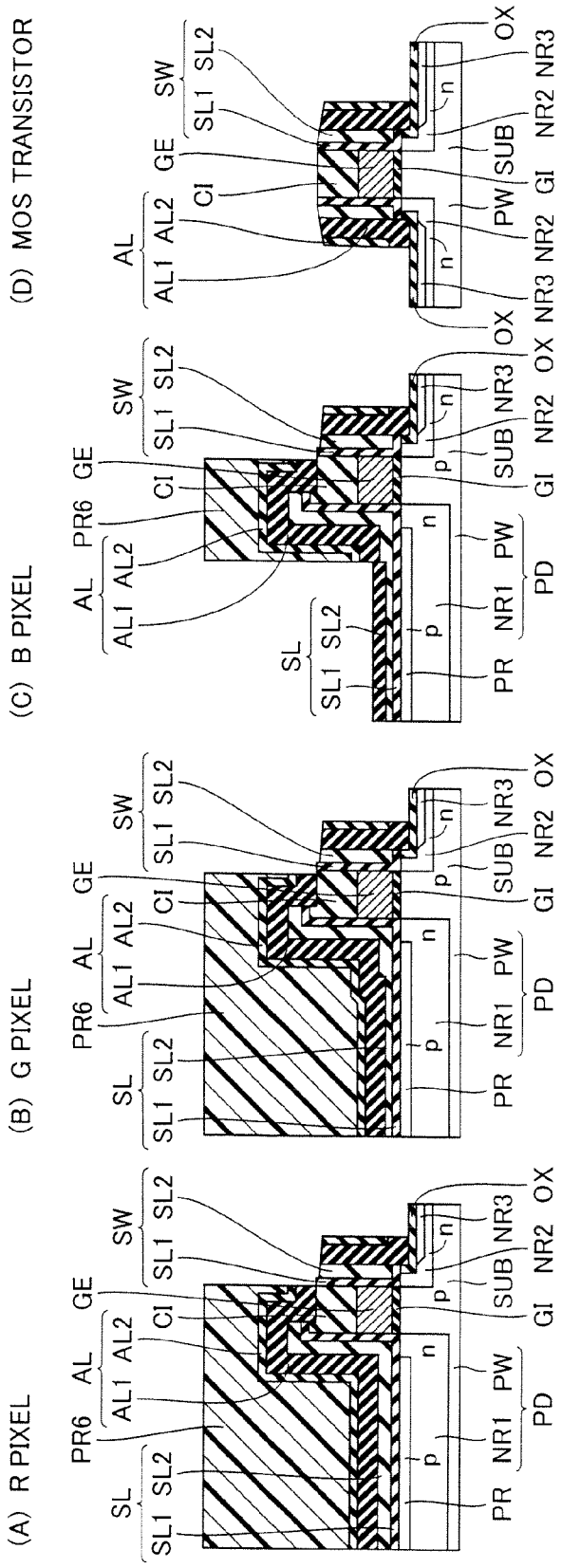
FIG. 27 is a schematic cross-sectional view showing a fourth step in the method of manufacturing a solid-state image sensing device in Embodiment 4 of the present invention.

Referring to FIG. 27, using the normal photolithography technique, photoresist pattern PR6 is formed on the surface of semiconductor substrate SUB. This photoresist pattern PR6 is formed to cover respective photodiodes PD of the R pixel and the G pixel and to provide openings on photodiode PD of the B pixel and the MOS transistor respectively. Using this photoresist pattern PR6 as a mask, upper antireflection coating AL of the B pixel is anisotropically etched. Upper insulating film AL2 is thus removed in the B pixel and its thickness is decreased. This etching may be performed to allow a part of a thickness of upper insulating film AL2 in the B pixel to remain or may be performed to decrease the thickness of lower insulating film AU after upper insulating film AL2 is completely removed.

Though a case where an end of photoresist pattern PR6 is located on gate electrode GE in each of the R pixel and the G pixel in FIGS. 27(A) to 27(B) is shown, the gate is effectively located high in this case. In general, in an image sensing element, a thinner film between contact layers is desirable in order to prevent vignetting, and hence the gate is also preferably located low. Therefore, the end of photoresist pattern PR6 may not be located on the gate so that the antireflection coating on the gate is etched. This is also the case with the B pixel in FIG. 27(C), and in this case, it is not necessary to provide photoresist pattern PR6.

Table 8 below shows thicknesses of "lower layer SiN," "intermediate layer TEOS" and "upper layer SiN" formed in each of the R pixel, the G pixel, and the B pixel in this state.

TABLE 8

| Structure | R | G | B |
| --- | --- | --- | --- |
| Upper Layer SiN | 0 to 100 nm | 0 to 100 nm | 0 to 50 nm |
| Intermediate Layer TEOS | 0 to 300 nm | 0 to 250 nm | 0 to 250 nm |
| Lower Layer SiN | 0 to 300 nm | 0 to 300 nm | 0 to 300 nm |

*SW = 0 to 400 nm

Figure 28:
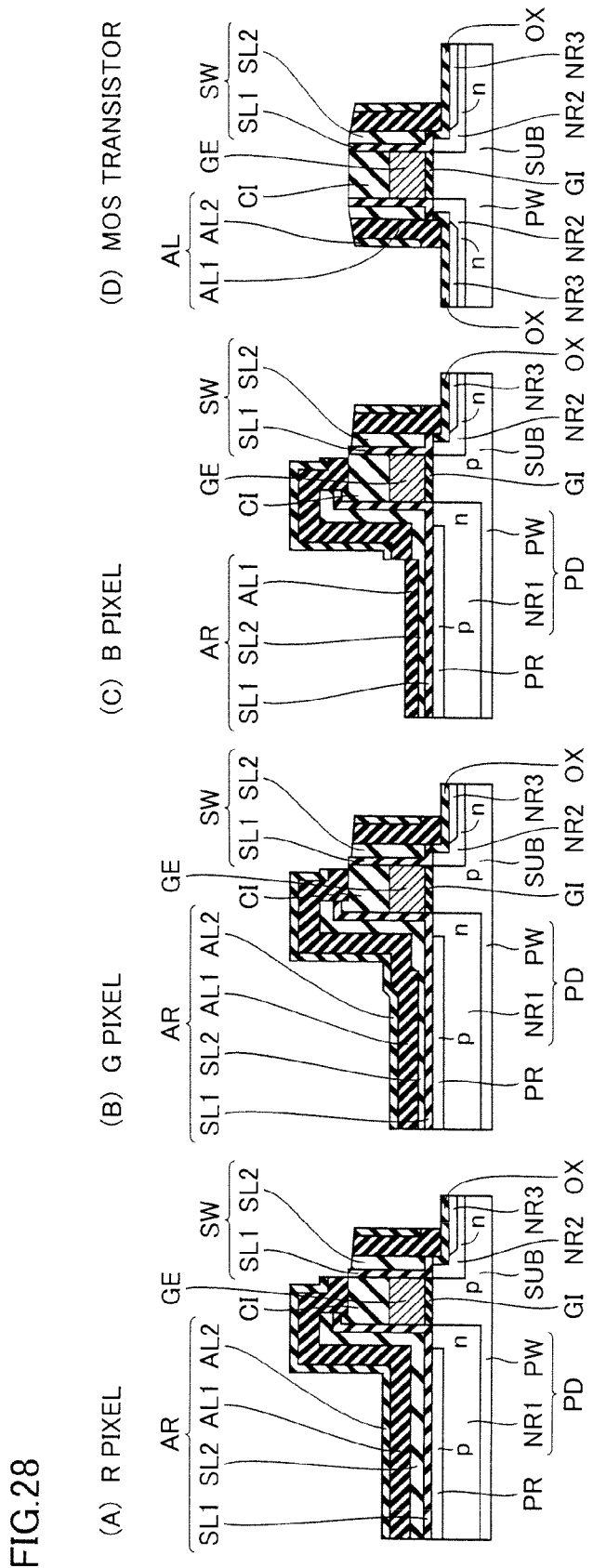
FIG. 28 is a schematic cross-sectional view showing a fifth step in the method of manufacturing a solid-state image sensing device in Embodiment 4 of the present invention.
Figure 29:
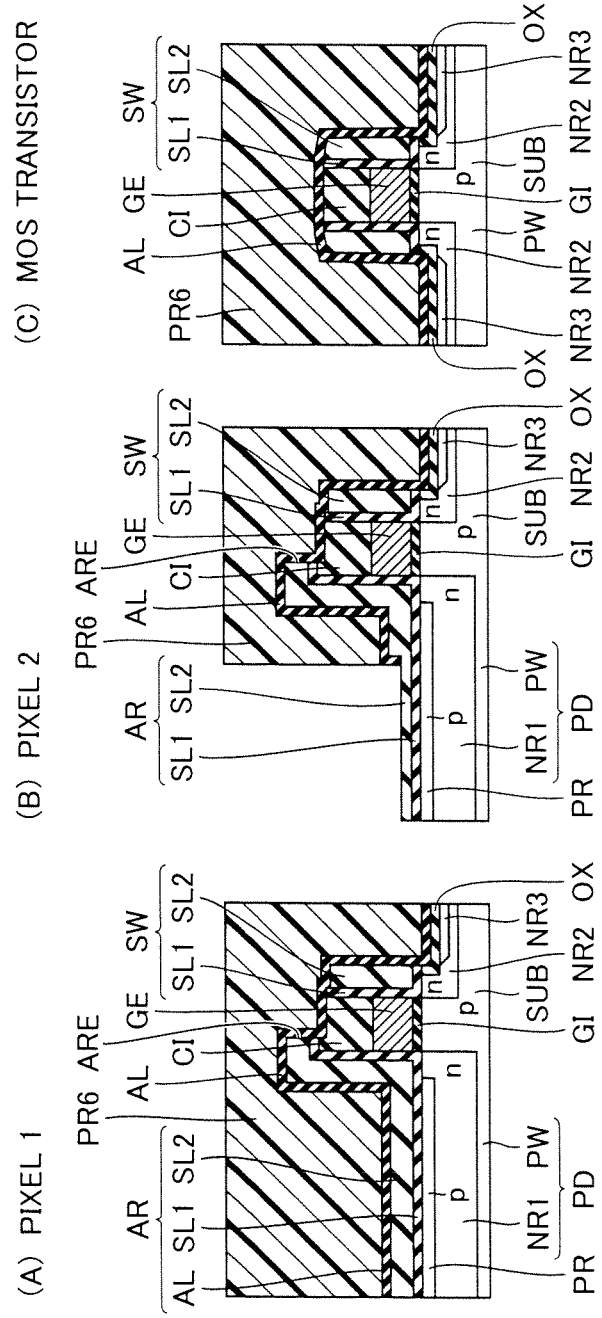
FIG. 29 is a schematic cross-sectional view showing a first step in a method of manufacturing a solid-state image sensing device in Embodiment 5 of the present invention.

Thereafter, as photoresist pattern PR6 (FIG. 27) is removed, for example, through ashing or the like, the construction shown in FIG. 28 is obtained. Thereafter, the solid-state image sensing device in the present embodiment is formed by going through the steps substantially the same as in Embodiment 2 shown in FIGS. 14 to 19.

According to the present embodiment, since additional upper antireflection coating AL is formed after sidewall SW is formed in the plurality of pixels PX, a function and effect the same as in Embodiment 1 is obtained. In addition, sidewall SW common to all MOS transistors can be formed and antireflection coating AR optimized for each of the R pixel, the G pixel and the B pixel can be realized in a relatively simplified process.

Embodiment 5

In the present embodiment, a method of forming a borderless active layer contact by using insulating film AL implementing the upper antireflection coating as an etching stopper film will be described mainly with reference to FIGS. 29 to 32.

The method of forming a borderless active layer contact in the present embodiment goes, for example, through the steps shown in FIGS. 3 to 11. Thereafter, referring to FIG. 29, using the normal photolithography technique, photoresist pattern PR6 is formed on the surface of semiconductor substrate SUB. This photoresist pattern PR6 is formed to cover photodiode PD of pixel 1 and the MOS transistor and to provide an opening on photodiode PD of pixel 2. Using this photoresist pattern PR6 as a mask, upper antireflection coating AL of pixel 2 is anisotropically etched. Thus, a thickness of antireflection coating AR of pixel 2 is controlled to be smaller than a thickness of antireflection coating AR of pixel 1. Here, insulating film AL on the MOS transistor (for example, a silicon nitride film) remains. Thereafter, photoresist pattern PR6 is removed, for example, through ashing or the like.

Figure 30:
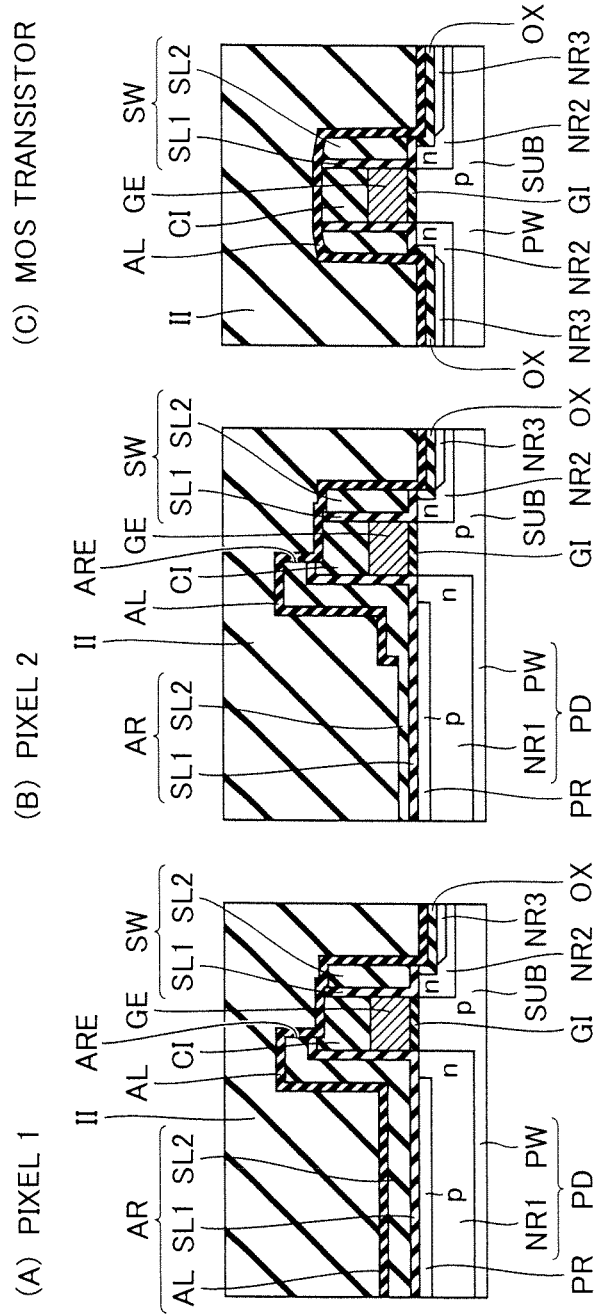
FIG. 30 is a schematic cross-sectional view showing a second step in the method of manufacturing a solid-state image sensing device in Embodiment 5 of the present invention.

Referring to FIG. 30, interlayer insulating film II is formed to cover photodiodes PD and the MOS transistor. This interlayer insulating film II is formed from a silicon oxide film made, for example, of TEOS as a source material, and it has a flat upper surface by being subjected to such planarization processing as CMP.

Figure 31:
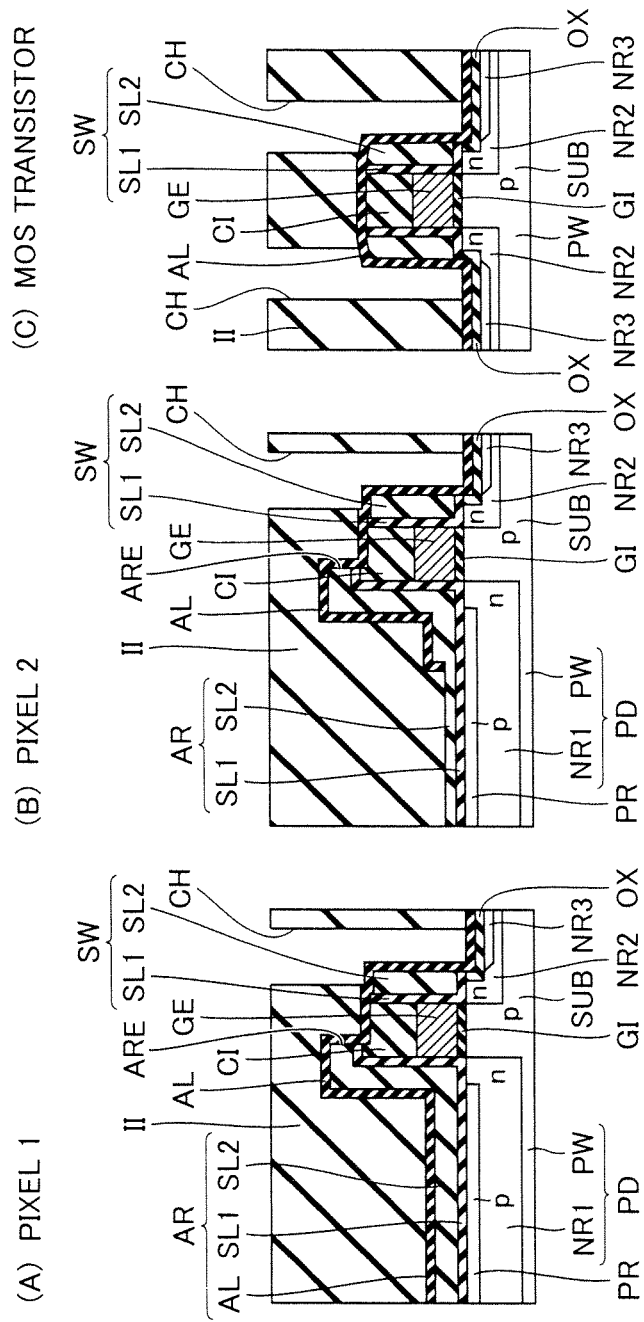
FIG. 31 is a schematic cross-sectional view showing a third step in the method of manufacturing a solid-state image sensing device in Embodiment 5 of the present invention.

Referring to FIG. 31, using the normal photolithography technique and etching technique, interlayer insulating film II is anisotropically etched until the surface of insulating film AL is exposed. For etching of this interlayer insulating film II, such an etching condition as avoiding as much as possible removal of insulating film AL by etching is selected. Through the etching above, contact hole CH exposing the surface of insulating film AL is formed in interlayer insulating film II.

Figure 32:
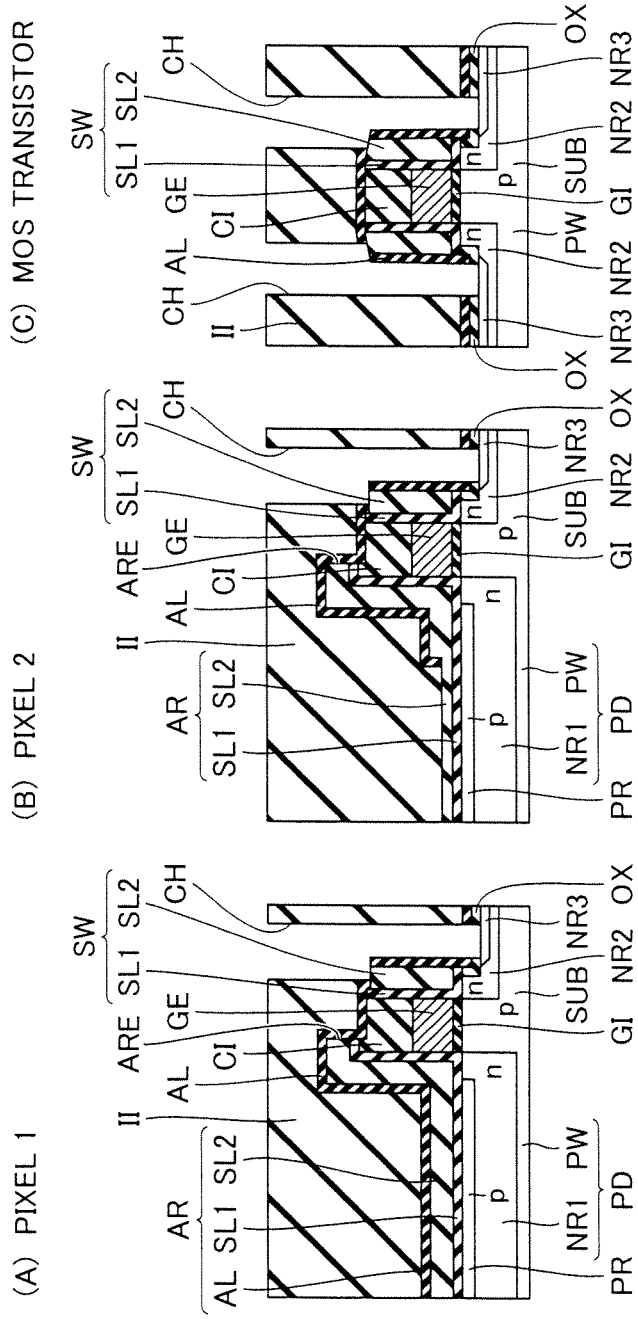
FIG. 32 is a schematic cross-sectional view showing a fourth step in the method of manufacturing a solid-state image sensing device in Embodiment 5 of the present invention.

Referring to FIG. 32, insulating film AL exposed through contact hole CH is etched to expose underlying insulating film OX. Etching performed on this insulating film AL is performed under an etching condition different from that in etching for removing the interlayer insulating film above. Thereafter, by further removing exposed insulating film OX by etching, source/drain region NR3 is exposed through contact hole CH. Thus, contact hole CH passing through interlayer insulating film II, insulating film AL and insulating film OX to reach source/drain region NR3 is formed.

In the present embodiment, contact hole CH is opened in interlayer insulating film II while insulating film AL remains to cover an upper portion and a side portion of sidewall SW. This insulating film AL as stopper is formed, for example, from a silicon nitride film, and hence a high selective etching ratio with respect to interlayer insulating film II formed from a silicon oxide film can be set. Therefore, during etching for forming contact hole CH, this insulating film AL as stopper functions as an etching stopper film.

In addition, in removing insulating film AL exposed through contact hole CH, since insulating film AL is smaller in thickness than interlayer insulating film II, partial removal of sidewall SW or the like under insulating film AL can be suppressed.

Thus, even when a position of opening contact hole CH may be displaced due to misregistration of a mask or the like, contact hole CH reaching source/drain region NR3 can be formed while suppressing partial removal of sidewall SW.

According to the present embodiment, since insulating film AL as stopper serves as an etching stopper, partial removal of sidewall SW can be suppressed and adaptation to reduction in size is facilitated.

Embodiment 6

Figure 33:
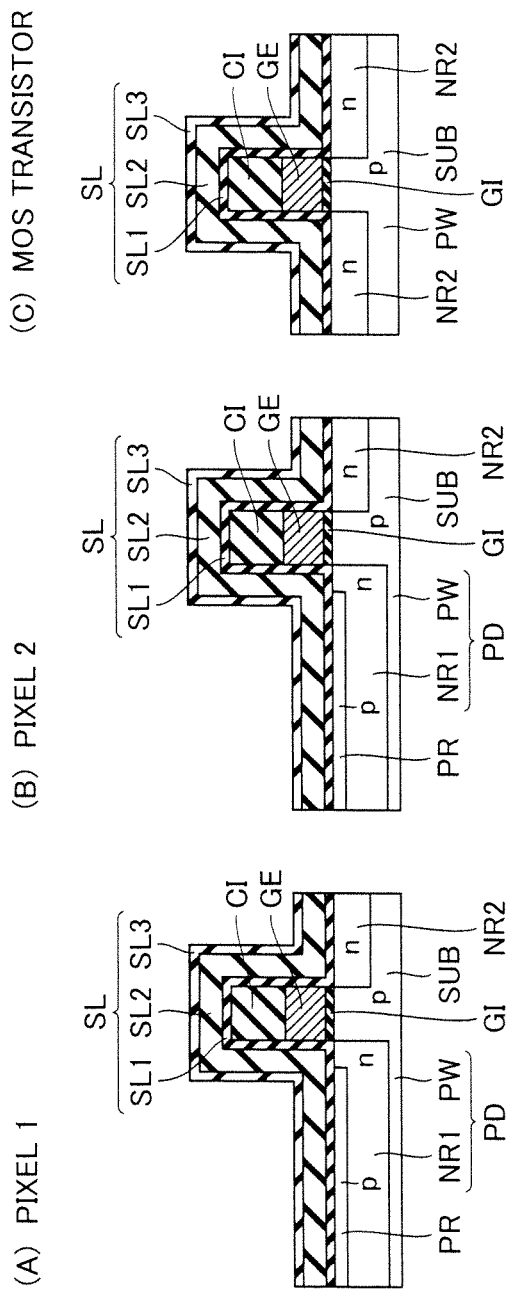
FIG. 33 is a schematic cross-sectional view showing a method of manufacturing a solid-state image sensing device in Embodiment 6 of the present invention.

Though a case where stack film SL has a two-layered structure has been described in Embodiments 1 to 5 above, stack film SL may have a three-layered structure as in the present embodiment shown in FIG. 33. This stack film SL has a construction in which lower insulating film SL1, an intermediate insulating film SL2, and an upper insulating film SL3 are stacked. Lower insulating film SL1 is formed, for example, from a silicon nitride film, intermediate insulating film SL2 is formed, for example, from a silicon oxide film made of TEOS as a source material, and upper insulating film SL3 is formed, for example, from a silicon nitride film. Alternatively, stack film SL may have a stack structure having four or more layers.

Embodiment 7

Figure 34:
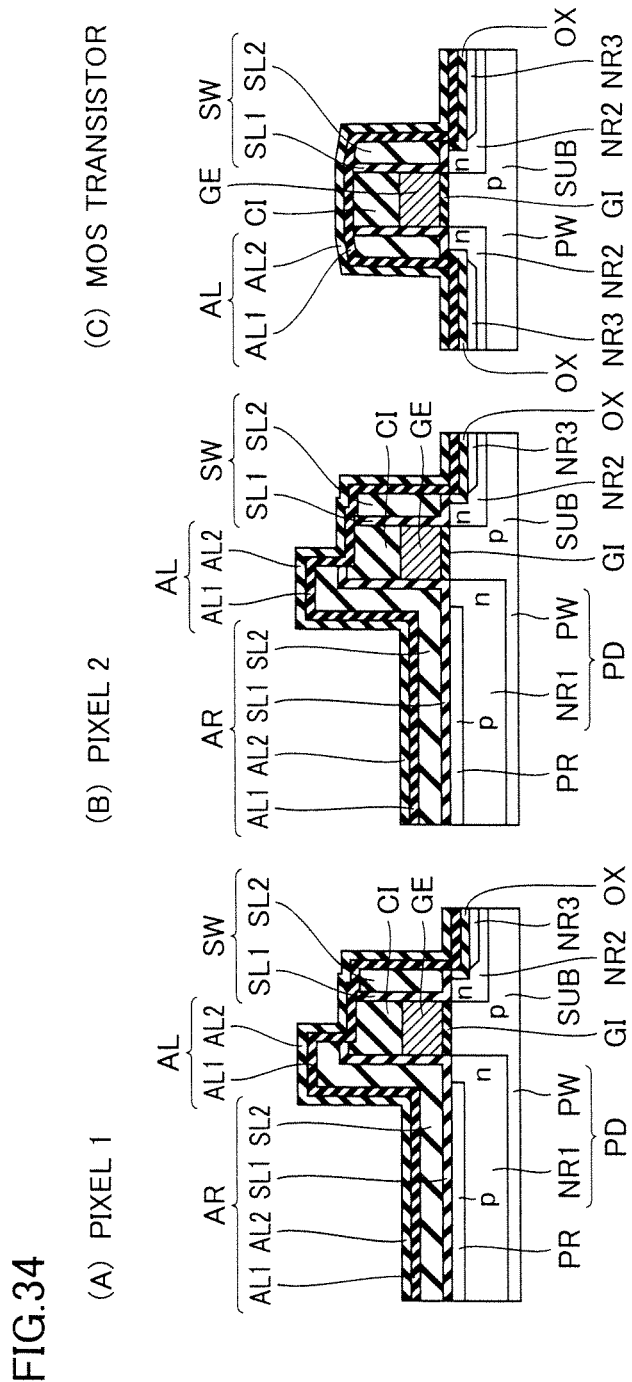
FIG. 34 is a schematic cross-sectional view showing a method of manufacturing a solid-state image sensing device in Embodiment 7 of the present invention.

Though a case where insulating film AL implementing the upper antireflection coating has a single-layered structure has been described in Embodiments 1 to 3 and 5 above, insulating film AL implementing the upper antireflection coating may have a two-layered structure as in the present embodiment shown in FIG. 34. This insulating film AL has lower insulating film AU and upper insulating film AL2. Lower insulating film AL1 is formed, for example, from a silicon oxide film, and upper insulating film AL2 is formed, for example, from a silicon nitride film. Alternatively, insulating film AL in Embodiments 1 to 5 may have a stack structure having three or more layers.

Embodiment 8

Figure 35:
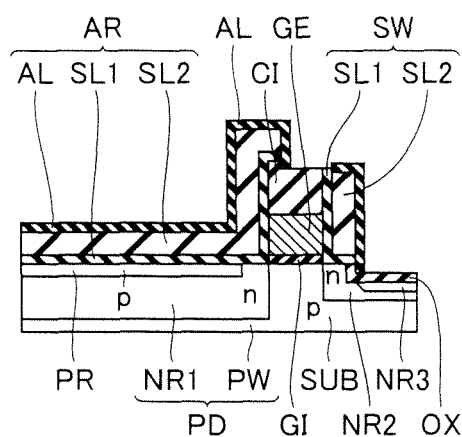
FIG. 35 is a schematic cross-sectional view showing a method of manufacturing a solid-state image sensing device in Embodiment 8 of the present invention.

Insulating film AL implementing the upper antireflection coating in Embodiments 1 to 5 above may be formed such that it is not deposited on semiconductor substrate SUB and gate electrode layer GE through selective growth as shown in FIG. 35. According to this method, since the step of etching the upper antireflection coating can be omitted, damage caused by the etching step to the MOS transistor can be mitigated.

Though the MOS transistor has been described in Embodiments 1 to 8 above, this transistor may be a MIS (Metal Insulator Semiconductor) transistor of which gate insulating film is formed from an insulating film other than a silicon oxide film, and it should only be an insulating gate field effect transistor. In addition, though the n-channel MOS transistor has been described, the transistor may be a p-channel MOS transistor.

Further, semiconductor substrate SUB and a well may have any conductivity type. Though photodiode PD has been described, the present invention is applicable to any device capable of photoelectric conversion.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

AL insulating film (upper antireflection coating); AL1 lower insulating film; AL2 upper insulating film; AR antireflection coating; ARS1, ARS2 end surface; ATR transistor for amplification; CH contact hole; CI cap insulating film; GE gate electrode layer; GI gate insulating film; HRL high-refraction-index film HRL; II, II2 interlayer insulating film; IL interconnection layer; LE lens; NR1, NR3 n-type region; NR2 n-type LDD region; PD photodiode; PL contact plug; PR p$^+$ region; PR1, PR1A, PR2, PR3, PR4, PR5, PR6 photoresist pattern; PS vertical signal line; PW p-type well region; PWS power supply line; PX pixel; RTR transistor for resetting; SL stack film (lower antireflection coating); SL1 lower insulating film; SL2 upper insulating film (intermediate insulating film); SL3 upper insulating film; SS selection signal line; STR transistor for selection; SUB semiconductor substrate; SW sidewall; TS transfer signal line; and TTR transistor for transfer.

The invention claimed is:

1. A method of manufacturing a solid-state image sensing device including a plurality of photoelectric conversion portions constituting a plurality of pixels, an insulating gate field effect transistor portion, and a plurality of first films formed on said plurality of photoelectric conversion portions respectively, the method comprising the steps of:

forming a stack film constituted of a plurality of insulating films so as to cover said plurality of photoelectric conversion portions and a gate electrode layer of said insulating gate field effect transistor portion;

selectively anisotropically etching said stack film such that said stack film remains on each of said plurality of photoelectric conversion portions to form a lower film and such that said stack film remains on a sidewall of said gate electrode layer to form a sidewall insulating film;

forming a source/drain region of said insulating gate field effect transistor portion by introducing an impurity into a region not covered with said gate electrode layer and said sidewall insulating film;

forming an upper film at least on said lower film after introduction of said impurity; and etching at least any of said upper film and said lower film such that said first films on at least two photoelectric conversion portions of said plurality of photoelectric conversion portions are different in thickness from each other, wherein said step of etching at least any of said upper film and said lower film includes the step of etching said lower film after said sidewall insulating film is formed and before said upper film is formed.

2. The method of manufacturing a solid-state image sensing device according to claim 1, wherein said step of etching at least any of said upper film and said lower film includes the step of etching at least said upper film after said upper film is formed.

3. The method of manufacturing a solid-state image sensing device according to claim 2, wherein said step of etching at least any of said upper film and said lower film includes the step of exposing said lower film by etching said upper film and thereafter etching exposed said lower film.

4. A method of manufacturing a solid-state image sensing device including a plurality of photoelectric conversion portions constituting a plurality of pixels, an insulating gate field effect transistor portion, and a plurality of first films formed on said plurality of photoelectric conversion portions respectively, the method comprising the steps of:

forming a stack film constituted of a plurality of insulating films so as to cover said plurality of photoelectric conversion portions and a gate electrode layer of said insulating gate field effect transistor portion;

selectively anisotropically etching said stack film such that said stack film remains on each of said plurality of photoelectric conversion portions to form a lower film and such that said stack film remains on a sidewall of said gate electrode layer to form a sidewall insulating film;

forming a source/drain region of said insulating gate field effect transistor portion by introducing an impurity into a region not covered with said gate electrode layer and said sidewall insulating film;

forming an upper film at least on said lower film after introduction of said impurity; and etching at least any of said upper film and said lower film such that said first films on at least two photoelectric conversion portions of said plurality of photoelectric conversion portions are different in thickness from each other, wherein said plurality of pixels include a first pixel, a second pixel and a third pixel for sensing images of light having colors different from one another, and said step of etching at least any of said upper film and said lower film includes the steps of etching respective said lower films on said photoelectric conversion portions of both of said second pixel and said third pixel while leaving said lower film on said photoelectric conversion portion of said first pixel after said sidewall insulating film is formed and before said upper film is formed, and etching said upper film on said photoelectric conversion portion of said third pixel after said upper film is formed.

5. The method of manufacturing a solid-state image sensing device according to claim 4, wherein said step of etching at least any of said upper film and said lower film includes the step of exposing said lower film by etching said upper film of said third pixel and thereafter etching exposed said lower film.

6. The method of manufacturing a solid-state image sensing device according to claim 1, wherein said upper film is formed from a single-layered silicon nitride film.

* * * * *